US012588389B2

(12) United States Patent
Shiiba

(10) Patent No.: US 12,588,389 B2
(45) Date of Patent: Mar. 24, 2026

(54) TRANSPARENT DISPLAY DEVICE

(71) Applicant: Panasonic Intellectual Property Management Co., Ltd., Osaka (JP)

(72) Inventor: Ken Shiiba, Kanagawa Ken (JP)

(73) Assignee: PANASONIC AUTOMOTIVE SYSTEMS CO., LTD., Kanagawa (JP)

( * ) Notice: Subject to any disclaimer, the term of this patent is extended or adjusted under 35 U.S.C. 154(b) by 378 days.

(21) Appl. No.: 18/238,306

(22) Filed: Aug. 25, 2023

(65) Prior Publication Data

US 2023/0413641 A1  Dec. 21, 2023

Related U.S. Application Data

(63) Continuation of application No. PCT/JP2022/002954, filed on Jan. 26, 2022.

(30) Foreign Application Priority Data

Mar. 11, 2021  (JP) ................................. 2021-039661

(51) Int. Cl.
  *H10K 59/50*    (2023.01)
  *G02F 1/137*    (2006.01)
      (Continued)
(52) U.S. Cl.
  CPC ............. *H10K 59/50* (2023.02); *G02F 1/137* (2013.01); *H10K 59/80518* (2023.02); *H10K 59/8791* (2023.02); *H10K 59/12* (2023.02)
(58) Field of Classification Search
  CPC ......................... H10K 59/50; H10K 59/80518
  See application file for complete search history.

(56) References Cited

U.S. PATENT DOCUMENTS 8,953,120 B2 * 2/2015 Yamazaki ............. G02F 1/1334
                                                        349/110
2007/0001591 A1   1/2007 Tanaka
                  (Continued)

FOREIGN PATENT DOCUMENTS

JP       2007-42612        2/2007
JP       2013-41100        2/2013
                  (Continued)

OTHER PUBLICATIONS

Office Action issued in Corresponding JP Patent Application No. 2023-505190, dated Apr. 1, 2025, along with an English translation thereof.

(Continued)

*Primary Examiner* — Nduka E Ojeh
(74) *Attorney, Agent, or Firm* — Greenblum & Bernstein, P.L.C.

(57) ABSTRACT

A transparent display device according to the present disclosure includes a first substrate, an internal layer, and a second substrate. The first substrate is capable of transmitting visible light. The internal layer is provided on a main surface of the first substrate, and includes a plurality of light emitting pixels and a plurality of dimming pixels that are arranged at different positions in plan view. Each of the plurality of light emitting pixels is configured to emit light independently, and each of the plurality of dimming pixels is configured to change transmittance thereof with respect to the visible light independently. The second substrate is provided on a side of the internal layer opposite to the first substrate, and is capable of transmitting the visible light.

17 Claims, 13 Drawing Sheets

(51) Int. Cl.
      *H10K 59/12*       (2023.01)
      *H10K 59/80*       (2023.01)

(56)           References Cited

U.S. PATENT DOCUMENTS

| | | | |
|---|---|---|---|
| 2012/0176570 A1 | 7/2012 | Yamazaki et al. | |
| 2015/0168776 A1* | 6/2015 | Song | H10K 59/121 |
| | | | 349/62 |
| 2016/0197131 A1* | 7/2016 | Park | G02F 1/133377 |
| | | | 438/23 |
| 2017/0146863 A1* | 5/2017 | Tang | G02F 1/133528 |
| 2018/0190735 A1* | 7/2018 | Son | H10K 59/128 |
| 2018/0190932 A1* | 7/2018 | Koo | H10K 59/80515 |
| 2019/0189708 A1* | 6/2019 | Lee | H10K 59/131 |
| 2019/0273122 A1 | 9/2019 | Iwasaki et al. | |
| 2022/0115629 A1 | 4/2022 | Suzuki et al. | |
| 2024/0255811 A1* | 8/2024 | Shiiba | G02F 1/1368 |

FOREIGN PATENT DOCUMENTS

| | | |
|---|---|---|
| JP | 5956149 | 7/2016 |
| JP | 2016-184175 | 10/2016 |
| JP | 2019-153411 | 9/2019 |
| WO | 2020/111101 | 6/2020 |
| WO | 2020/121779 | 6/2020 |

OTHER PUBLICATIONS

International Search Report Issued in International Patent Application No. PCT/JP2022/002954, dated Mar. 29, 2022, along with an English translation thereof.

* cited by examiner

FIG.23

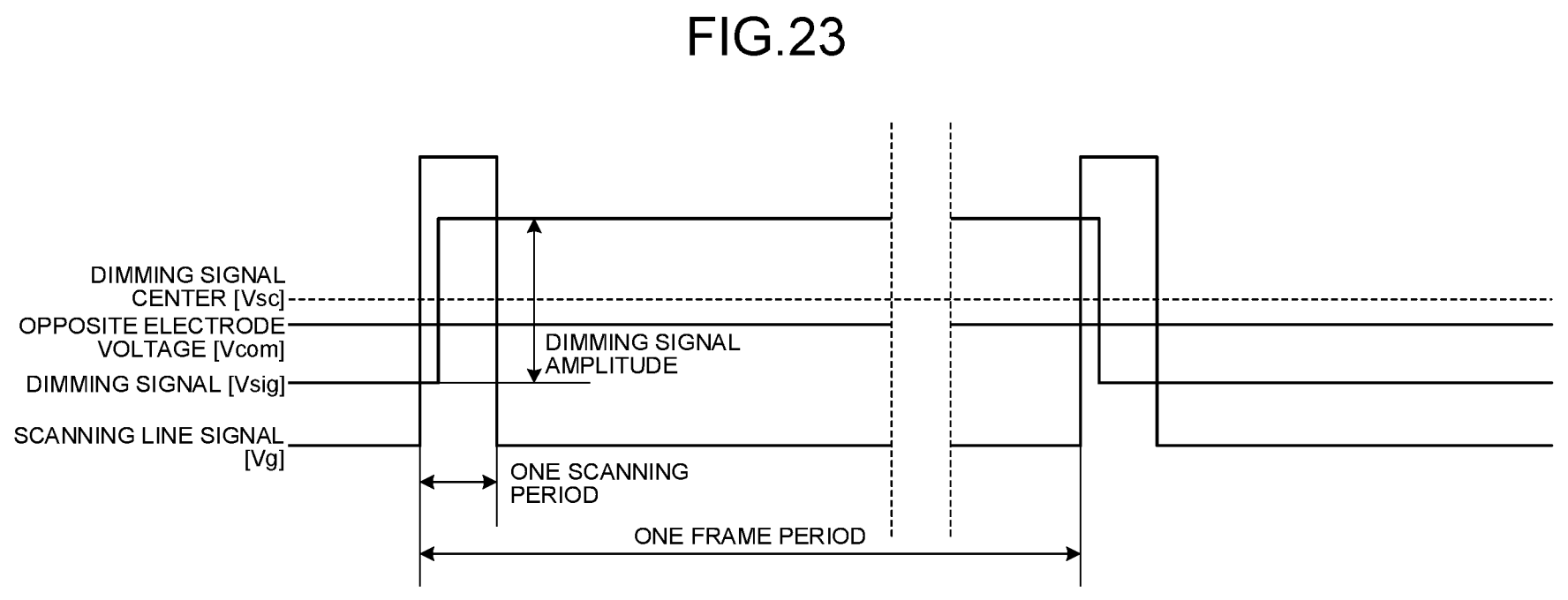

DIMMING SIGNAL CENTER [Vsc]

OPPOSITE ELECTRODE VOLTAGE [Vcom]

DIMMING SIGNAL [Vsig]

SCANNING LINE SIGNAL [Vg]

DIMMING SIGNAL AMPLITUDE

ONE SCANNING PERIOD

ONE FRAME PERIOD

TRANSPARENT DISPLAY DEVICE

CROSS-REFERENCE TO RELATED APPLICATIONS

This application is a continuation of International Application No. PCT/JP2022/002954, filed on Jan. 26, 2022 which claims the benefit of priority of the prior Japanese Patent Application No. 2021-039661, filed on Mar. 11, 2021, the entire contents of which are incorporated herein by reference.

FIELD

Embodiments described herein relate generally to a transparent display device.

BACKGROUND

Conventionally, there is known a technique related to a transparent display device that has a light emitting layer sandwiched between a pair of transparent electrodes, is capable of displaying an image and character information on a display surface based on light from the light emitting layer, and is capable of transmitting external light from a back surface toward the display surface (e.g., see JP 2013-041100 A).

Further improvement is required in a transparent display device.

SUMMARY

A transparent display device according to the present disclosure includes a first substrate, an internal layer, and a second substrate. The first substrate is capable of transmitting visible light. The internal layer is provided on a main surface of the first substrate, and includes a plurality of light emitting pixels and a plurality of dimming pixels that are arranged at different positions in plan view. Each of the plurality of light emitting pixels is capable of emitting light independently, and each of the plurality of dimming pixels independently changes transmittance thereof with respect to the visible light. The second substrate is provided on a side of the internal layer opposite to the first substrate, and is capable of transmitting the visible light.

BRIEF DESCRIPTION OF THE DRAWINGS

FIG. 23 is a signal waveform diagram schematically illustrating an example of dimming control of the transparent display device according to the embodiment.

DETAILED DESCRIPTION

Figure 1:
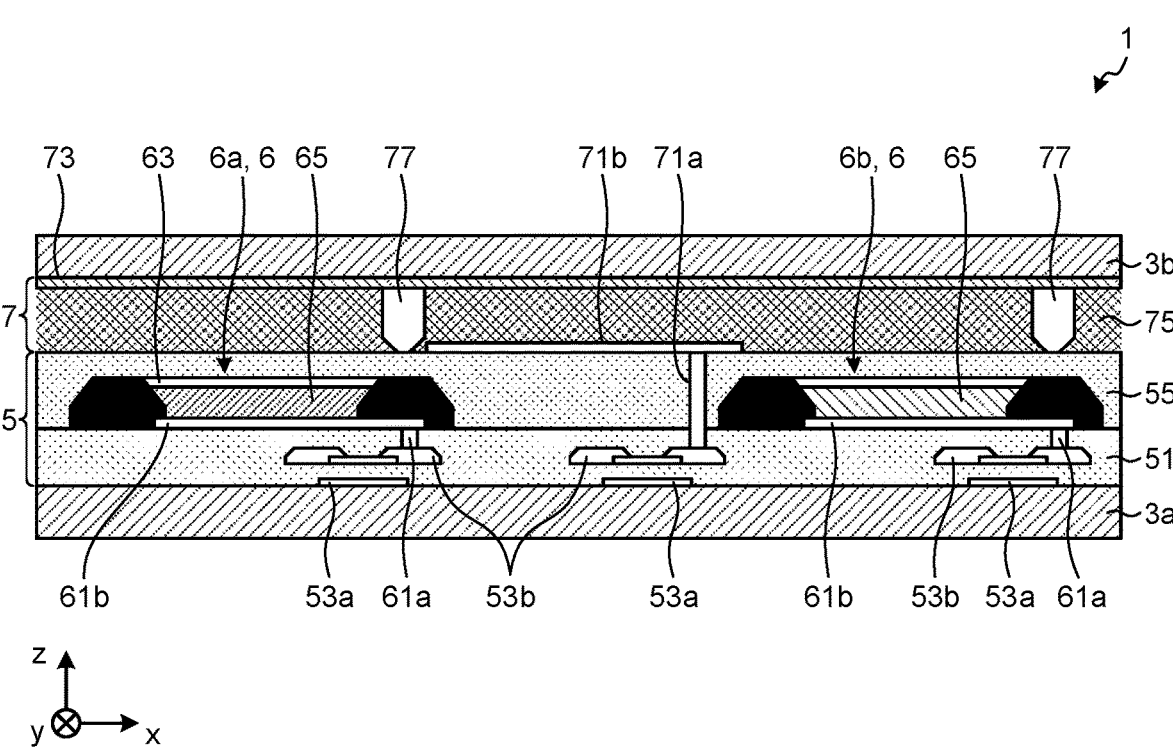
FIG. 1 is a cross-sectional view schematically illustrating an example of a configuration of a transparent display device according to a first embodiment.

Underlying Knowledge Forming Basis of the Invention

In a transparent display device, display based on light from a light emitting layer may be difficult to see, for example, when the amount of external light is larger than the amount of light from the light emitting layer.

Hereinafter, embodiments of a transparent display device according to the present disclosure will be described with reference to the drawings. In the present embodiment, a transparent display device used as a video playback device, a navigation device, or the like mounted on an automobile is exemplified. Note that the configuration of the transparent display device according to each embodiment described below is an example, and is not limited to the following description.

In the following description, components having the same or substantially the same functions as those described above with reference to the previous drawings will be denoted by the same reference numerals, and the description thereof may be appropriately omitted. In addition, in the case of representing the same or substantially the same portion as well, the dimensions and ratios may be represented differently from each other depending on the drawings. Furthermore, for example, from the viewpoint of ensuring visibility of the drawings, in the description of each drawing, only main components are denoted by reference numerals, and even components having the same or substantially the same functions as those described above in the previous drawings may not be denoted by reference numerals.

In the following description, "transparent" includes the concept of "having transparency or translucency". That is, "transparent" is not limited to a state in which transmitted light is not absorbed, and includes a state in which a degree of absorption of transmitted light is small. In addition, "opaque" includes the concept of "opaque or low translucency". That is, "opaque" is not limited to a state in which light is not transmitted, that is, light is shielded, and includes a state in which a degree of absorption of transmitted light is large. In addition, in the present specification, "transmittance" refers to a ratio of brightness (light amount) of visible light passing through a panel to brightness (light amount) of visible light incident on the panel. In other words, "transmittance" is transmittance with respect to visible light.

In the following description, for the sake of simplicity of description, it is assumed that the front surface and the back surface of a transparent display device are surfaces parallel to the x-y plane. In addition, it is assumed that a direction from the back surface to the front surface of the transparent display device is defined as a z+ direction. That is, in the following description, the front surface side means the z+ side. Similarly, the back surface side means the z– side.

First Embodiment

FIG. 1 is a cross-sectional view schematically illustrating an example of a configuration of a transparent display device 1 according to a first embodiment. The transparent display device 1 according to the present embodiment is assumed to be an organic EL display (OLED). Further, the transparent display device 1 according to the present embodiment is assumed to be a bottom emission type transparent display.

That is, a display surface of the transparent display device 1 according to the present embodiment is provided on the back surface side.

As illustrated in FIG. 1, the transparent display device 1 includes a pair of glass substrates 3a and 3b. The pair of glass substrates 3a and 3b are disposed substantially parallel and spaced apart from each other. A thin film transistor (TFT) substrate 5 and a dimming layer 7 are provided between the pair of glass substrates 3a and 3b.

The glass substrate 3a is provided on the back surface side of the transparent display device 1. The glass substrate 3b is provided on the front surface side of the transparent display device 1. Each of the glass substrate 3a and the glass substrate 3b is transparent to visible light. Each of the glass substrate 3a and the glass substrate 3b has, for example, a rectangular flat plate shape. Here, the glass substrate 3a is an example of a first substrate. The glass substrate 3b is an example of a second substrate.

The TFT substrate 5 is provided on the front surface side of the glass substrate 3a on the back surface side. As the TFT substrate 5, a-Si, LTPS, IGZO, or the like can be appropriately used. The TFT substrate 5 is formed of, for example, a plate-shaped member, but may be formed of a film-shaped member. A plurality of TFTs 102 (refer to FIG. 22) are arranged in a matrix on the TFT substrate 5. Each of the plurality of TFTs 102 has a gate electrode 53a and a source-drain electrode 53b. The source-drain electrode 53b is provided on the front surface side at a position corresponding to the gate electrode 53a. In the TFT substrate 5, each of the plurality of TFTs 102 is covered with an insulating member 51. The insulating member 51 may be made of a material that is transparent to visible light and has electrical insulation. As the insulating member 51, for example, silicon nitride (SiN) can be used.

The TFT substrate 5 is provided with a plurality of light emitting units 6. Each of the plurality of light emitting units 6 corresponds to each of the plurality of light emitting pixels 100 (refer to FIG. 22) of the transparent display device 1. Each of the plurality of light emitting units 6 is configured to emit light independently of each other. Each of the plurality of light emitting units 6 is electrically connected to the source-drain electrode 53b of the TFT 102 via a transparent electrode 61a extending in the z– direction inside the insulating member 51. The transparent electrode 61a is an electrode transparent to visible light. Each of the plurality of light emitting units 6 is separated from the TFT 102 by, for example, the insulating member 51. Each of the plurality of light emitting units 6 includes a transparent electrode 61b, a reflective electrode 63, and a light emitting layer 65. The transparent electrode 61b and the reflective electrode 63 are disposed in substantially parallel and spaced apart from each other. A light emitting layer 65 is provided between the transparent electrode 61b and the reflective electrode 63. Here, the TFT substrate 5 is an example of a first internal layer.

The transparent electrode 61b is provided on the back surface side of each of the plurality of light emitting units 6. The transparent electrode 61b is electrically connected to the transparent electrode 61a. The transparent electrode 61b is transparent to visible light. The transparent electrode 61b has, for example, a rectangular flat plate shape.

The reflective electrode 63 is provided on the front surface side of each of the plurality of light emitting units 6. The reflective electrode 63 is provided at a position facing the transparent electrode 61b. The reflective electrode 63 has, for example, a shape similar to that of the transparent electrode 61b. The reflective electrode 63 is opaque to visible light. For example, the reflective electrode 63 is made of metal. Alternatively, the reflective electrode 63 is formed of glass, resin, or the like having a metal layer provided on the front surface thereof.

The light emitting layer 65 is a light emitting diode (LED) made of an organic compound. The light emitting layer 65 emits light when a voltage exceeding a threshold voltage is applied between the transparent electrode 61$b$ and the reflective electrode 63.

Each of the plurality of light emitting units 6 is covered with an insulating member 55. The insulating member 55 may be made of a material that is transparent to visible light and has electrical insulation. As the insulating member 55, for example, silicon nitride (SiN) can be used.

The dimming layer 7 is provided on the front surface side of the TFT substrate 5. The dimming layer 7 includes a transparent electrode 71$a$, a transparent electrode 71$b$, a transparent electrode 73, a dimming member 75, and a spacer 77. Here, the dimming layer 7 is an example of a second internal layer.

The transparent electrode 71$b$ is provided on the front surface side of the insulating member 55. The transparent electrode 71$b$ is electrically connected to the source-drain electrode 53$b$ of the TFT 102 via the transparent electrode 71$a$ extending in the z– direction inside the insulating member 51 and the insulating member 55. The transparent electrode 71$b$ is transparent to visible light. The transparent electrode 71$b$ has, for example, a rectangular flat plate shape.

The transparent electrode 73 is provided on the front surface side of the insulating member 55 with the spacer 77 interposed therebetween. In other words, the transparent electrode 73 is provided substantially parallel to the transparent electrode 71$b$ while being separated from the transparent electrode 71$b$ by the length of the spacer 77 in the z direction. The glass substrate 3$b$ is provided on the front surface side of the transparent electrode 73. The transparent electrode 73 is transparent to visible light. The transparent electrode 73 has, for example, a rectangular flat plate shape.

The dimming member 75 is filled between the transparent electrode 71$b$ and the transparent electrode 73. That is, the spacer 77 is a member configured to form a gap filled with the dimming member 75 between the transparent electrode 71$b$ and the transparent electrode 73. The dimming member 75 is transparent to visible light in a state where no voltage is applied between the transparent electrode 71$b$ and the transparent electrode 73. Hereinafter, a state in which the dimming member 75 is transparent to visible light is referred to as a transmission mode. The dimming member 75 is opaque to visible light between the transparent electrode 71$b$ and the transparent electrode 73 in a state where a voltage exceeding a threshold voltage is applied between the transparent electrode 71$b$ and the transparent electrode 73. Hereinafter, a state in which the dimming member 75 is opaque to visible light is referred to as a dimming mode. As the dimming member 75, guest-host liquid crystal, polymer network liquid crystal (PNLC), suspended particles (SPD), an electrochromic material, and the like can be appropriately used. The dimming member 75 may be appropriately selected according to, for example, the characteristics of the operating voltage and the response speed. For example, the dimming member 75 transitions between the transmission mode and the dimming mode according to the voltage applied between the transparent electrode 71$b$ and the transparent electrode 73 by the TFT substrate 5. In other words, in the dimming member 75, the transmittance with respect to visible light changes according to the voltage applied between the transparent electrode 71$b$ and the transparent electrode 73 by the TFT substrate 5. Therefore, it is preferable that the operation voltage required for the mode transition is low enough to drive the dimming member 75 by the TFT substrate 5. A structure in which the dimming member 75 is sandwiched between the transparent electrode 71$b$ and the transparent electrode 73 may be referred to as a dimming pixel.

Figure 2:
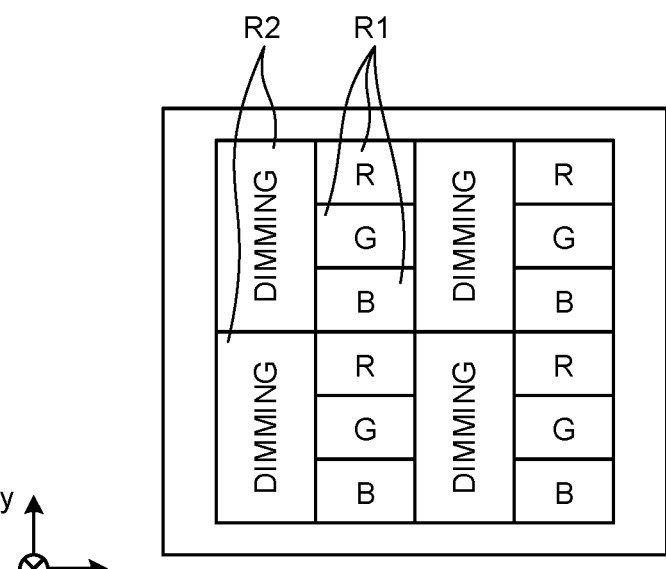
FIG. 2 is a plan view schematically illustrating an example of the configuration of the transparent display device according to the first embodiment.
Figure 3:
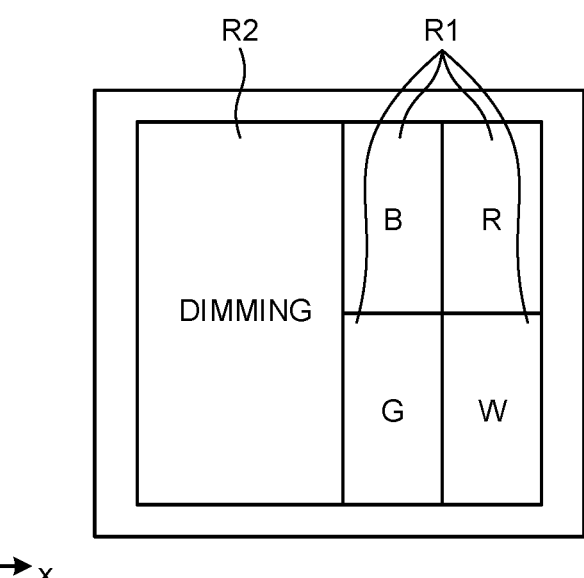
FIG. 3 is a plan view schematically illustrating another example of the configuration of the transparent display device according to the first embodiment.

FIG. 2 is a plan view schematically illustrating an example of a configuration of the transparent display device 1 according to the first embodiment. FIG. 3 is a plan view schematically illustrating another example of the configuration of the transparent display device 1 according to the first embodiment. The transparent display device 1, as illustrated in FIGS. 2 and 3, has a light emitting region R1 and a dimming region R2. As illustrated in FIGS. 2 and 3, the light emitting region R1 and the dimming region R2 are regions different from each other in plan view.

The light emitting region R1 is a region in which each pixel of the TFT substrate 5 is disposed. That is, the light emitting region R1 is a region in which the light emitting unit 6 is provided. FIG. 2 illustrates a case in which an R pixel, a G pixel, and a B pixel are provided in the light emitting region R1. Note that, as illustrated in FIG. 3, the light emitting region R1 may be provided with an R pixel, a G pixel, a B pixel, and a W pixel.

The dimming region R2 is a region corresponding to a portion of the dimming layer 7 located between the transparent electrode 71$b$ and the transparent electrode 73. That is, the dimming region R2 is a region corresponding to a portion of the dimming layer 7 where the transparent electrode 71$b$ is provided. The dimming region R2 is also a region in which the dimming pixel is provided. Here, the dimming region R2 is provided at least in a transparent region provided between the pixels of the TFT substrate 5 in plan view. More specifically, in the example illustrated in FIG. 1, the light emitting unit 6 and the transparent electrode 71$b$ are regions different from each other in plan view.

Next, a description will be given as to an operation of the transparent display device 1 according to the embodiment. Here, it is assumed that a light emitting unit 6$a$ corresponds to the R pixel and generates red light. In addition, it is assumed that a light emitting unit 6$b$ generates green light.

Figure 4:
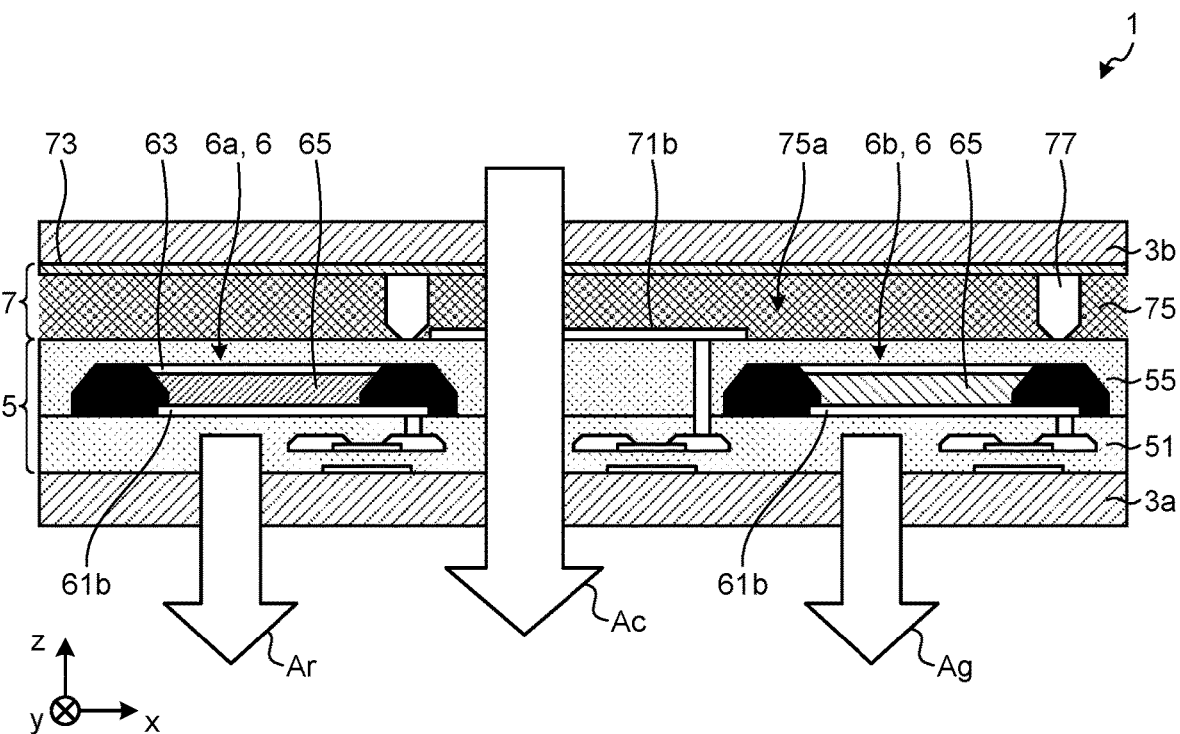
FIG. 4 is a cross-sectional view schematically illustrating an example of a configuration in a transmission mode of the transparent display device according to the first embodiment.

FIG. 4 is a cross-sectional view schematically illustrating an example of a configuration in a transmission mode of the transparent display device 1 according to the first embodiment. As indicated by an arrow Ar in FIG. 4, the light emitting unit 6$a$ emits red light from the light emitting layer 65 to the back surface side. Similarly, as indicated by an arrow Ag in FIG. 4, the light emitting unit 6$b$ emits green light from the light emitting layer 65 to the back surface side. In addition, in a state where no voltage is applied between the transparent electrode 71$b$ and the transparent electrode 73, the dimming member 75 is transparent to visible light. Therefore, external light Ac incident on the transparent display device 1 from the front surface side is transmitted through a dimming member 75$a$ in the transmission mode and emitted from the back surface side. The external light incident on the transparent display device 1 from the back surface side is transmitted through the dimming member 75$a$ in the transmission mode and emitted from the front surface side.

Figure 5:
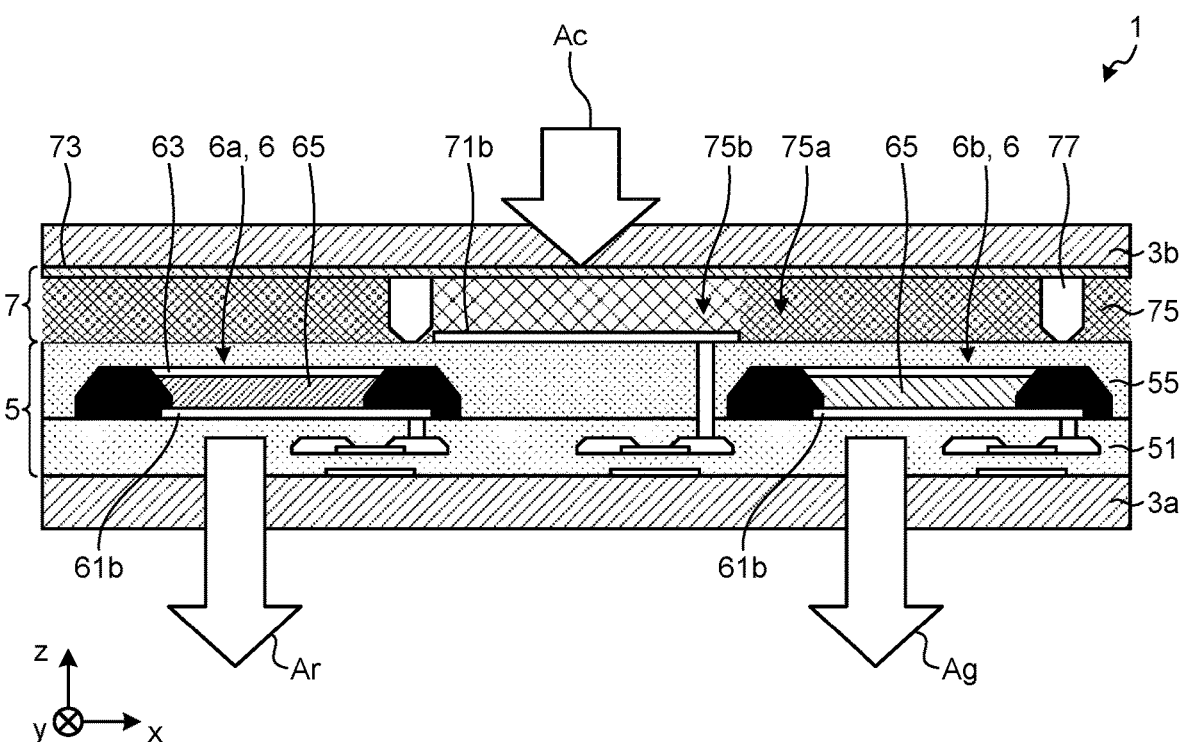
FIG. 5 is a cross-sectional view schematically illustrating an example of a configuration in a dimming mode of the transparent display device according to the first embodiment.

FIG. 5 is a cross-sectional view schematically illustrating an example of a configuration in a dimming mode of the transparent display device 1 according to the first embodiment. As illustrated in FIG. 5, the light emitting unit 6$a$ and the light emitting unit 6$b$ emit visible light to the back surface side, similarly to the transmission mode. On the other hand, in a state where a voltage exceeding the threshold voltage is applied between the transparent electrode 71*b* and the transparent electrode 73, the dimming member 75 is opaque to visible light between the transparent electrode 71*b* and the transparent electrode 73. Therefore, the external light Ac incident on the transparent display device 1 from the front surface side is shielded by a dimming member 75*b* in the dimming mode. Note that external light incident on the transparent display device 1 from the back surface side is also shielded by the dimming member 75*b* in the dimming mode.

As described above, the light from the light emitting unit 6 and the external light transmitted through the transparent display device 1 are emitted from the display surface of the transparent display device 1 in the transmission mode, that is, the back surface side. Therefore, a user can see the background scene on the side opposite to the display surface of the transparent display device 1, that is, on the front surface side, together with the display by the transparent display device 1. Thus, for example, the transparent display device 1 can display an image superimposed on the background scene.

Under such circumstances, in an environment where the amount of external light is larger than that of light emitted from the light emitting unit 6, visibility of an image to be displayed deteriorates in the transparent display device 1 in the transmission mode.

Conventionally, in a self-luminous transparent display having a light emitting region and a transparent region in a pixel, a technique of bonding a dimming device configured to change transmittance of visible light to the back surface side thereof is known. However, when the transmittance of visible light is changed in the entire display area, partial dimming according to the display image cannot be performed, so that a region other than the display image is dimmed.

On the other hand, for example, there is a technique of bonding, on the pixel-by-pixel basis, a dimming device capable of changing the transmittance of visible light to the back surface side of a transparent display. However, depending on the accuracy of bonding, positional deviation occurs between a transparent pixel of a transparent display and a dimming pixel of a dimming device, and there is a problem that variations in transmittance in a display area increase. In addition, there is a problem that an interference fringe (moire) based on diffraction by a lattice-shaped pattern of the transparent display and a lattice-shaped pattern of the dimming device occurs due to the positional deviation. Here, the lattice-shaped pattern of the transparent display is a pattern based on a structure between pixels of the transparent display or between a light emitting region and a transparent region. In addition, the lattice-shaped pattern of the dimming device is a pattern based on a structure between pixels of the dimming device. In addition, there is a problem that the transmittance greatly changes depending on the viewing angle due to the interval of about several mm existing between the transparent display and the dimming device.

On the other hand, in the transparent display device 1 according to the present embodiment, the transparent electrode 71*b* of the dimming layer 7 is provided in a region between the respective pixels of the TFT substrate 5, that is, in a region overlapping a region through which external light can be transmitted in plan view. The transparent electrode 73 is provided on the side of the glass substrate 3*b* facing the transparent electrode 71*b*. A liquid crystal material for changing the transmittance is sealed between the transparent electrode 71*b* and the transparent electrode 73. According to this configuration, by applying a voltage exceeding the threshold voltage between the transparent electrode 71*b* and the transparent electrode 73, the transmittance of liquid crystal with respect to visible light can be changed in the region overlapping with the region through which external light can be transmitted in plan view.

As described above, with the transparent display device 1 according to the first embodiment, further improvement can be realized. With the transparent display device 1 according to the first embodiment, for example, visibility can be improved.

In the transparent display device 1 according to the present embodiment, the dimming layer 7 is formed on the TFT substrate 5. In other words, the TFT substrate 5 and the dimming layer 7 are formed to be integrated. Therefore, as compared with a case in which the independently formed transparent display and dimming device are bonded to each other, it is possible to suppress a positional deviation between a transparent region between the light emitting regions R1 of the TFT substrate 5 and the dimming region R2 of the dimming layer 7.

Further, in the transparent display device 1 according to the present embodiment, since the TFT substrate 5 and the dimming layer 7 are formed to be integrated, it is not necessary to provide a glass substrate between the TFT substrate 5 and the dimming layer 7. Therefore, according to the technique of the present embodiment, as compared with a case in which the independently formed transparent display and dimming device are bonded to each other, the number of glass substrates can be reduced from four to two, and it is possible to realize thickness reduction and weight reduction.

Second Embodiment

Figure 6:
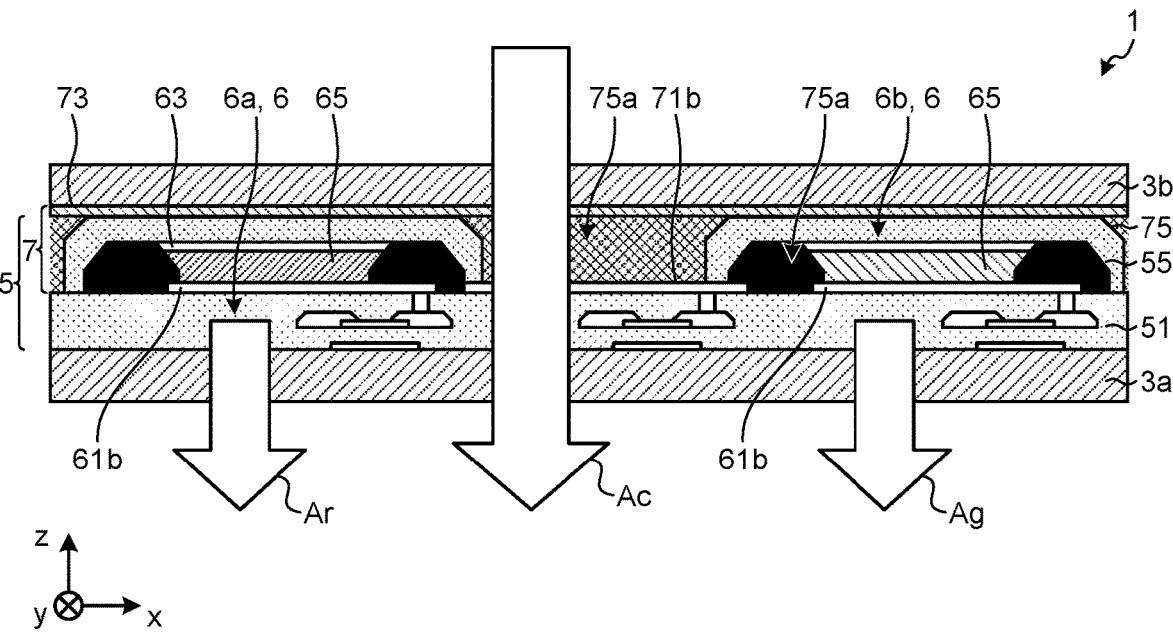
FIG. 6 is a cross-sectional view schematically illustrating an example of a configuration in a transmission mode of a transparent display device according to a second embodiment.
Figure 7:
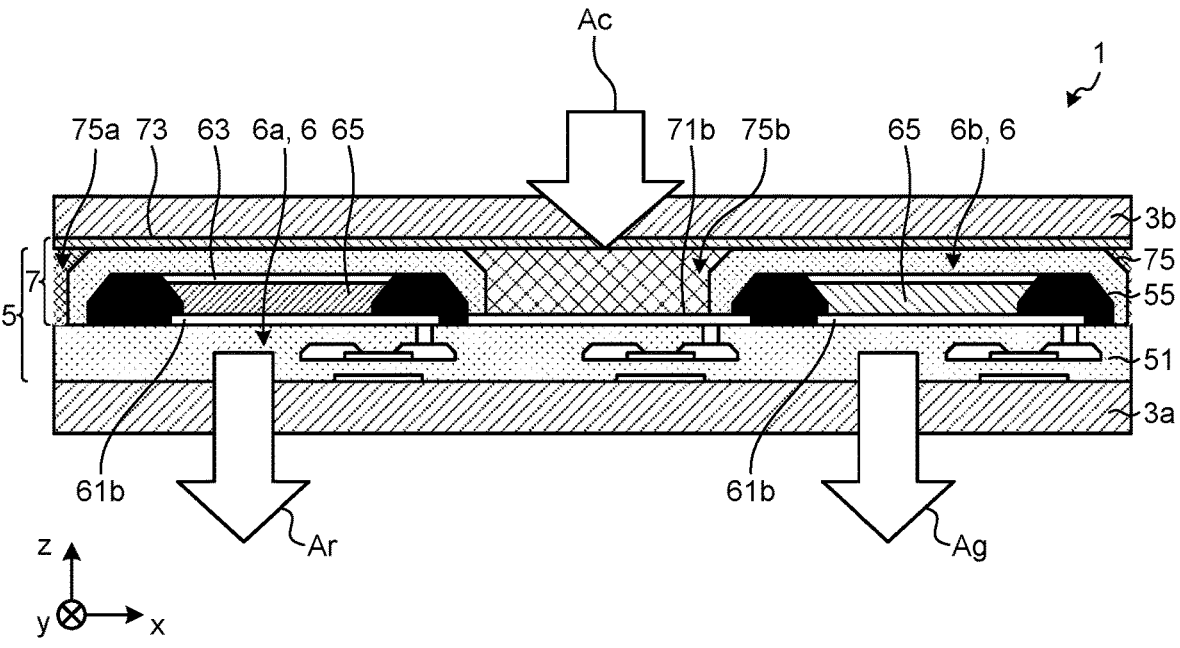
FIG. 7 is a cross-sectional view schematically illustrating an example of a configuration in a dimming mode of the transparent display device according to the second embodiment.

FIG. 6 is a cross-sectional view schematically illustrating an example of a configuration in a transmission mode of a transparent display device 1 according to a second embodiment. FIG. 7 is a cross-sectional view schematically illustrating an example of a configuration in a dimming mode of the transparent display device 1 according to the second embodiment.

A dimming layer 7 of the transparent display device 1 according to the present embodiment may not include a spacer 77.

As an example, a gap filled with a dimming member 75 in the dimming layer 7 is formed by an insulating member 55 covering a light emitting unit 6 of a TFT substrate 5, as illustrated in FIGS. 6 and 7. Specifically, a transparent electrode 71*b* is provided on the front surface side of an insulating member 51. The transparent electrode 71*b* is electrically connected to a source-drain electrode 53*b* of a TFT 102 via a transparent electrode 71*a* extending in the z–direction inside the insulating member 51. A transparent electrode 73 is provided on the front surface side of the insulating member 51 with the insulating member 55 interposed therebetween. In other words, the transparent electrode 73 is provided substantially parallel to the transparent electrode 71*b* while being separated from the transparent electrode 71*b* by the length in the z direction of the insulating member 55 covering the light emitting unit 6.

According to this configuration as well, similarly to the transparent display device 1 according to the first embodiment, visibility can be improved. In addition, since the layer of the TFT substrate 5 on which the insulating member 55 is provided and the dimming layer 7 are formed to be integrated, it is possible to realize thickness reduction and weight reduction as compared with the transparent display device 1 according to the first embodiment.

Third Embodiment

Figure 8:
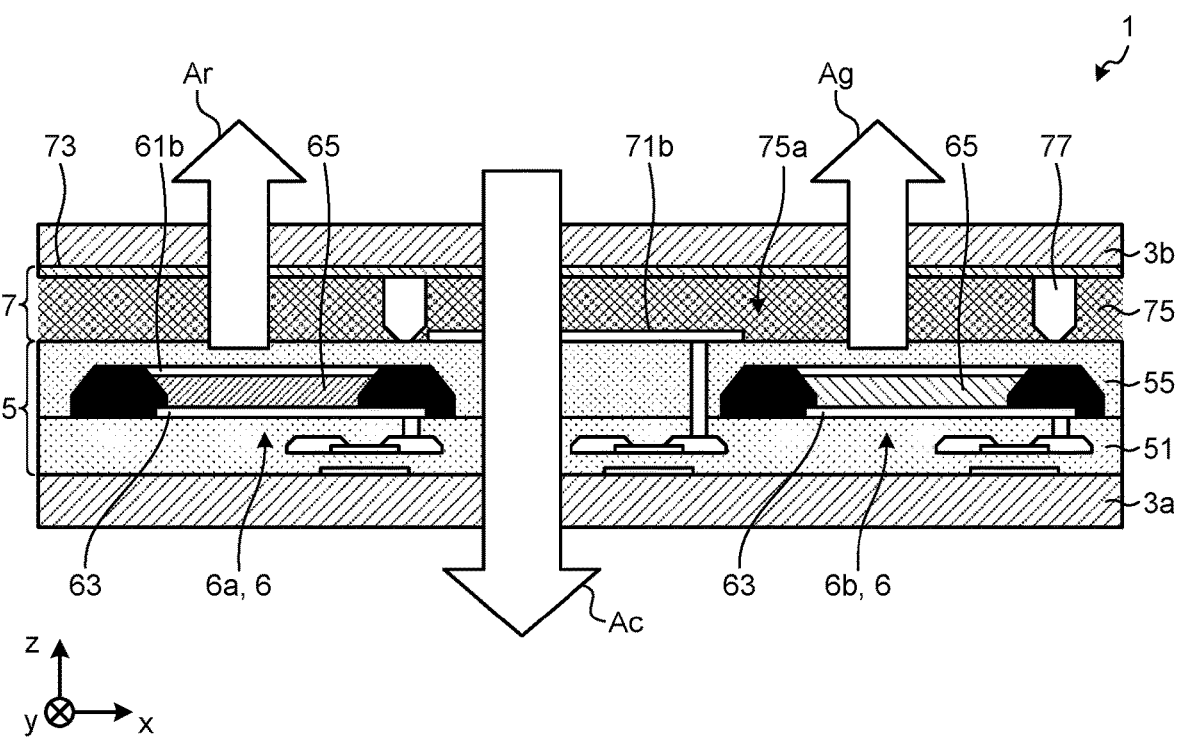
FIG. 8 is a cross-sectional view schematically illustrating an example of a configuration in a transmission mode of a transparent display device according to a third embodiment.
Figure 9:
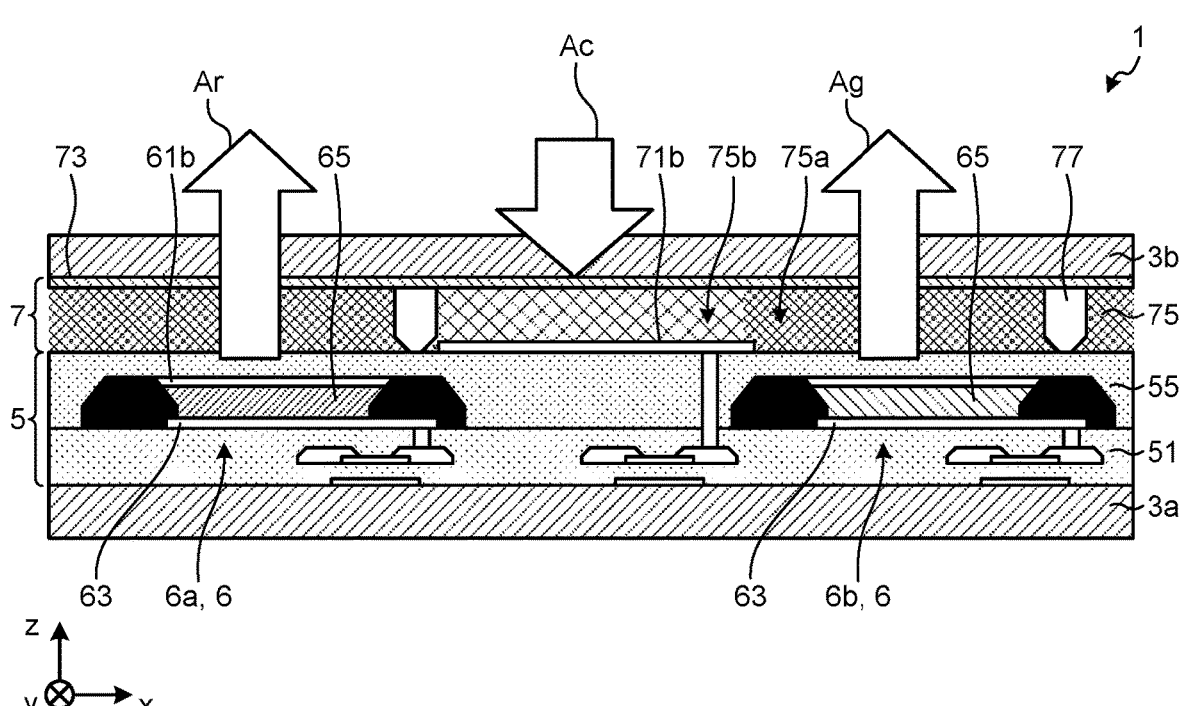
FIG. 9 is a cross-sectional view schematically illustrating an example of a configuration in a dimming mode of the transparent display device according to the third embodiment.

FIG. 8 is a cross-sectional view schematically illustrating an example of a configuration in a transmission mode of a transparent display device 1 according to a third embodiment. FIG. 9 is a cross-sectional view schematically illustrating an example of a configuration in a dimming mode of the transparent display device 1 according to the third embodiment.

The transparent display device 1 according to the present embodiment may be a top emission type transparent display. That is, the display surface of the transparent display device 1 according to the present embodiment is provided on the front surface side.

As illustrated in FIGS. 8 and 9, a transparent electrode 61b is provided on the front surface side of each of the plurality of light emitting units 6. On the other hand, a reflective electrode 63 is provided at a position facing the transparent electrode 61b on the back surface side of each of the plurality of light emitting units 6. The reflective electrode 63 is electrically connected to a transparent electrode 61a.

As indicated by an arrow Ar in FIGS. 8 and 9, a light emitting unit 6a emits red light from a light emitting layer 65 to the front surface side. Similarly, a light emitting unit 6b emits green light from the light emitting layer 65 to the front surface side, as indicated by an arrow Ag in FIGS. 8 and 9. In addition, external light Ac incident on the transparent display device 1 from the front surface side passes through a dimming member 75a in the transmission mode and is emitted from the back surface side. On the other hand, the external light Ac incident on the transparent display device 1 from the front surface side is shielded by a dimming member 75b in the dimming mode.

As described above, the transparent display device 1 according to the present embodiment is configured as a top emission type transparent display. Here, a dimming layer 7 is provided on the display surface side. According to this configuration as well, similarly to the transparent display device 1 according to the first embodiment, visibility can be improved.

In the transparent display device 1 according to the present embodiment, similarly to the transparent display device 1 according to the second embodiment, the layer of the TFT substrate 5 on which the insulating member 55 is provided and the dimming layer 7 may be formed to be integrated.

Fourth Embodiment

Figure 10:
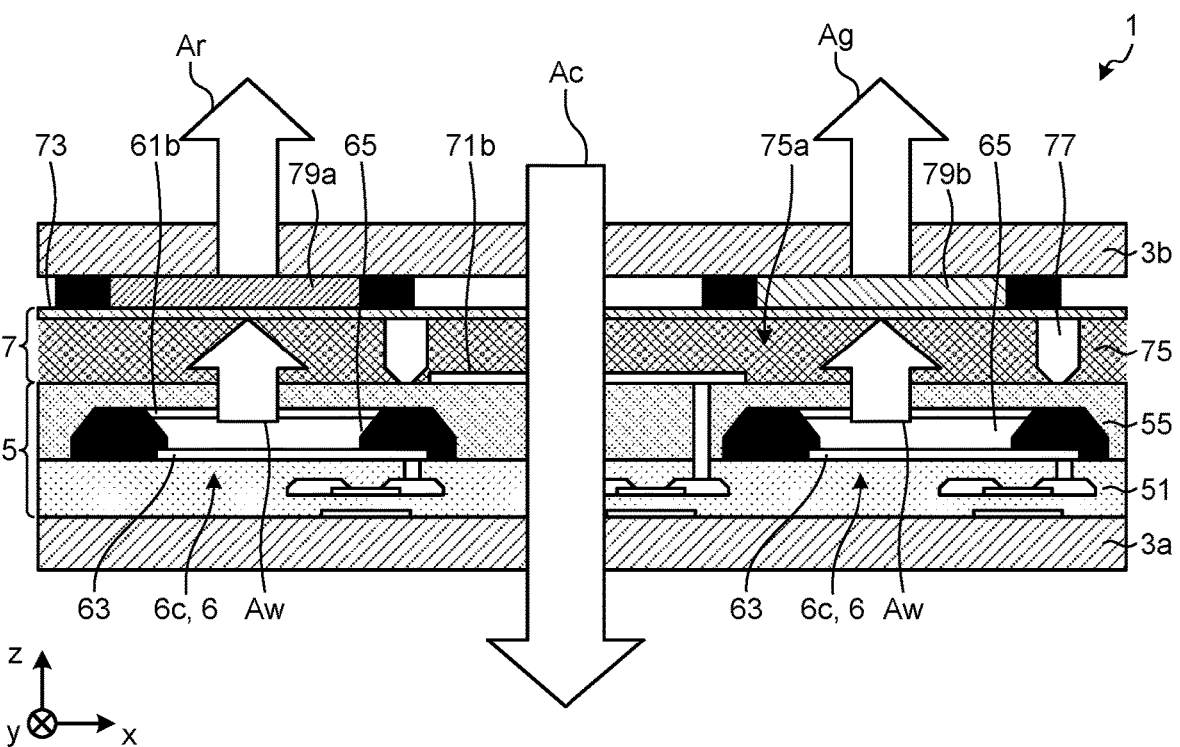
FIG. 10 is a cross-sectional view schematically illustrating an example of a configuration in a transmission mode of a transparent display device according to a fourth embodiment.
Figure 11:
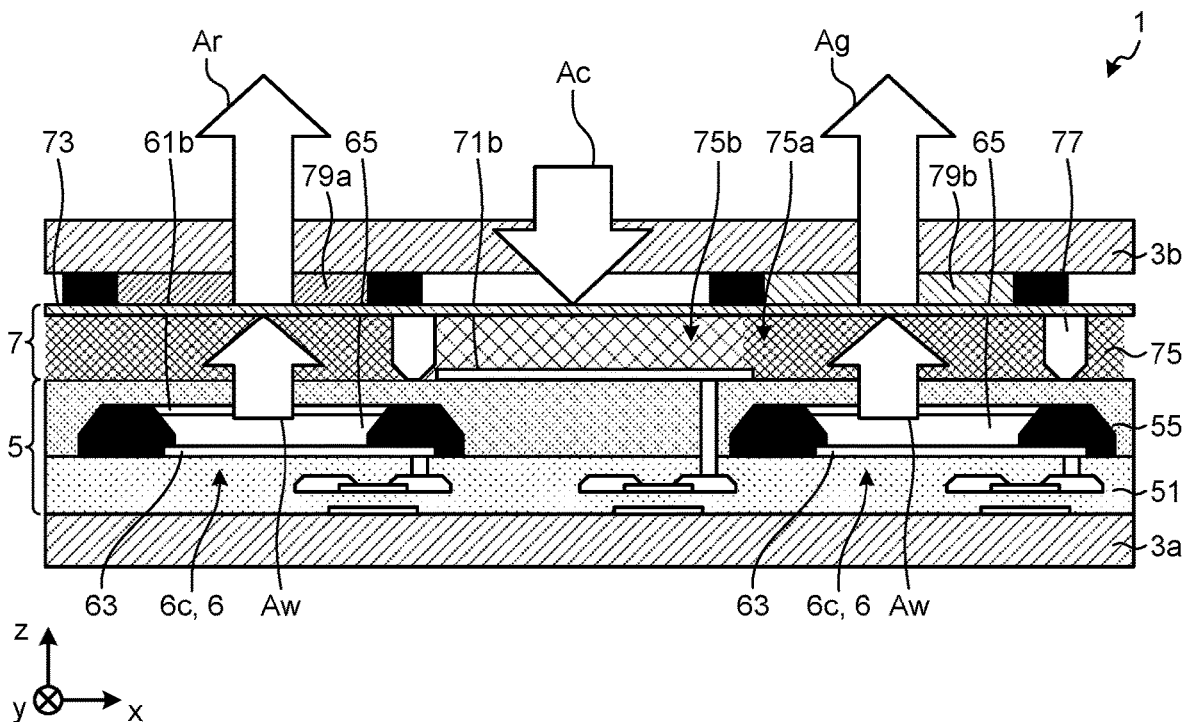
FIG. 11 is a cross-sectional view schematically illustrating an example of a configuration in a dimming mode of the transparent display device according to the fourth embodiment.

FIG. 10 is a cross-sectional view schematically illustrating an example of a configuration in a transmission mode of a transparent display device 1 according to a fourth embodiment. FIG. 11 is a cross-sectional view schematically illustrating an example of a configuration in a dimming mode of the transparent display device 1 according to the fourth embodiment.

Each of the plurality of light emitting units 6 according to the present embodiment has, for example, the same light emitting layer 65. As an example, it is assumed that each of the plurality of light emitting units 6c generates white light, as indicated by an arrow Aw in FIGS. 10 and 11.

The transparent display device 1 according to the present embodiment further includes a plurality of color filters 79. Each of the plurality of color filters 79 is provided between a transparent electrode 73 and a glass substrate 3b. Each of the plurality of color filters 79 is provided at a position overlapping the plurality of light emitting units 6 in plan view. Each of the plurality of color filters 79 has predetermined wavelength selectivity. A color filter 79a is, for example, a color filter that transmits red light. A color filter 79b is, for example, a color filter that transmits green light.

As described above, in the transparent display device 1 according to the present embodiment, white light from each of the plurality of light emitting units 6c is incident on the corresponding color filter 79. Each of the plurality of color filters 79 emits visible light having a wavelength corresponding to wavelength selectivity to the back surface side. According to this configuration as well, similarly to the transparent display device 1 according to the first embodiment, visibility can be improved.

Each of the plurality of light emitting units 6c is not limited to white light, and may be an OLED that generates visible light in any wavelength region. In this case, the wavelength selectivity of the color filter 79 may be determined according to the wavelength region of the visible light from the light emitting unit 6c.

Note that the transparent display device 1 according to the present embodiment may be configured as the bottom emission type transparent display, similarly to the transparent display device 1 according to the first embodiment or the second embodiment. In this case, each of the plurality of color filters 79 may be provided on the back surface side of the corresponding light emitting unit 6c.

In the transparent display device 1 according to the present embodiment, similarly to the transparent display device 1 according to the second embodiment, the layer of the TFT substrate 5 on which the insulating member 55 is provided and the dimming layer 7 may be formed to be integrated.

Further, in the transparent display device 1 according to the present embodiment, a space between the plurality of color filters 79 may be filled with a dimming member 75 of the dimming layer 7.

Fifth Embodiment

Figure 12:
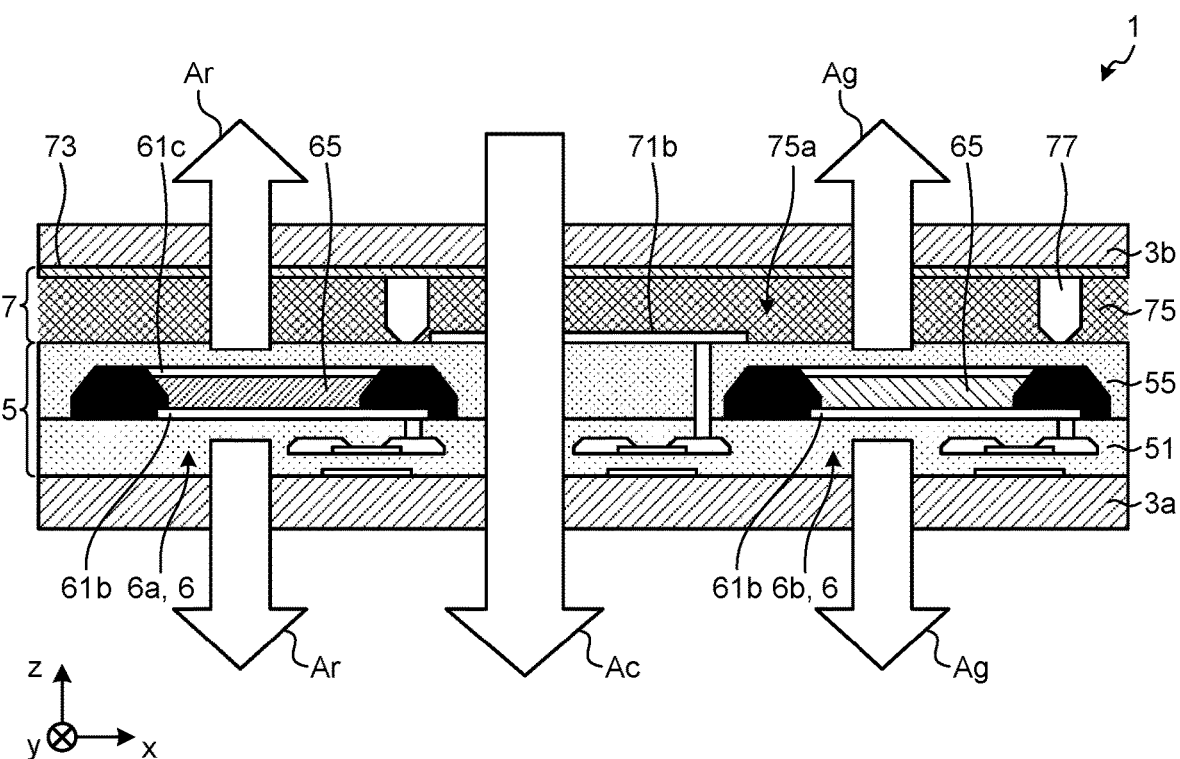
FIG. 12 is a cross-sectional view schematically illustrating an example of a configuration in a transmission mode of a transparent display device according to a fifth embodiment.
Figure 13:
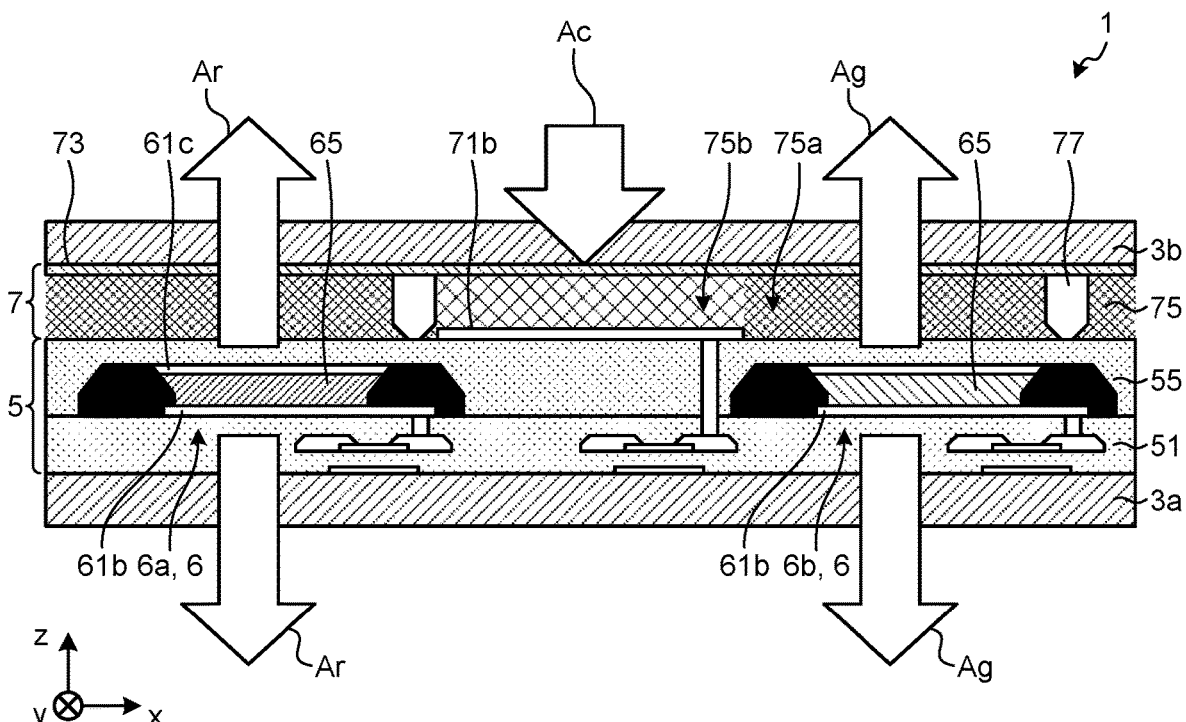
FIG. 13 is a cross-sectional view schematically illustrating an example of a configuration in a dimming mode of the transparent display device according to the fifth embodiment.

FIG. 12 is a cross-sectional view schematically illustrating an example of a configuration in a transmission mode of a transparent display device 1 according to a fifth embodiment. FIG. 13 is a cross-sectional view schematically illustrating an example of a configuration in a dimming mode of the transparent display device 1 according to the fifth embodiment.

The transparent display device 1 according to the present embodiment may be a transparent display having display surfaces on both the front surface side and the back surface side.

As illustrated in FIGS. 12 and 13, a transparent electrode 61b is provided on the back surface side of each of the plurality of light emitting units 6. The transparent electrode 61b is electrically connected to the transparent electrode 61a. Here, the transparent display device 1 according to the present embodiment includes a transparent electrode 61c instead of the reflective electrode 63. The transparent electrode 61c is provided at a position facing the transparent electrode 61b on the front surface side of each of the plurality of light emitting units 6. The transparent electrode 61c is transparent to visible light. For example, the transparent electrode 61c has the same shape as the transparent electrode 61b.

As indicated by an arrow Ar in FIGS. 12 and 13, a light emitting unit 6a emits red light from a light emitting layer 65 to both the front surface side and the back surface side. Similarly, as indicated by an arrow Ag in FIGS. 12 and 13, a light emitting unit 6b emits green light from the light emitting layer 65 to both the front surface side and the back surface side. In addition, external light Ac incident on the transparent display device 1 from the front surface side passes through a dimming member 75a in the transmission mode and is emitted from the back surface side. On the other hand, the external light Ac incident on the transparent display device 1 from the front surface side is shielded by a dimming member 75b in the dimming mode. In addition, external light incident on the transparent display device 1 from the back surface side is also shielded by the dimming member 75b in the dimming mode.

As described above, the transparent display device 1 according to the present embodiment is configured as a transparent display having display surfaces respectively disposed on both the front surface side and the back surface side. According to this configuration as well, similarly to the transparent display device 1 according to the first embodiment, visibility can be improved.

In the transparent display device 1 according to the present embodiment, similarly to the transparent display device 1 according to the second embodiment, the layer of the TFT substrate 5 on which the insulating member 55 is provided and the dimming layer 7 may be formed to be integrated.

Note that the transparent display device 1 according to the present embodiment may be provided with a plurality of color filters 79, similarly to the transparent display device 1 according to the fourth embodiment. In this case, the plurality of color filters 79 may be further provided on the back surface side of a corresponding light emitting unit 6c in addition to between a transparent electrode 73 and a glass substrate 3b.

Sixth Embodiment

Figure 14:
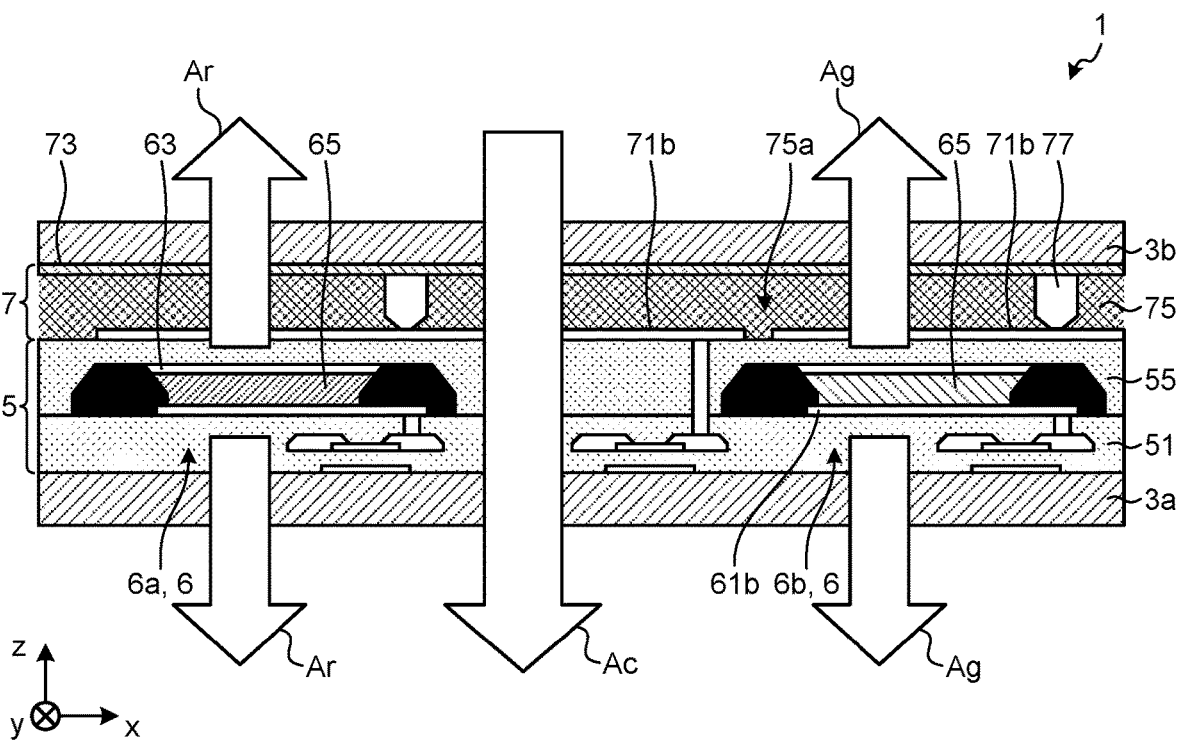
FIG. 14 is a cross-sectional view schematically illustrating an example of a configuration in a transmission mode of a transparent display device according to a sixth embodiment.
Figure 15:
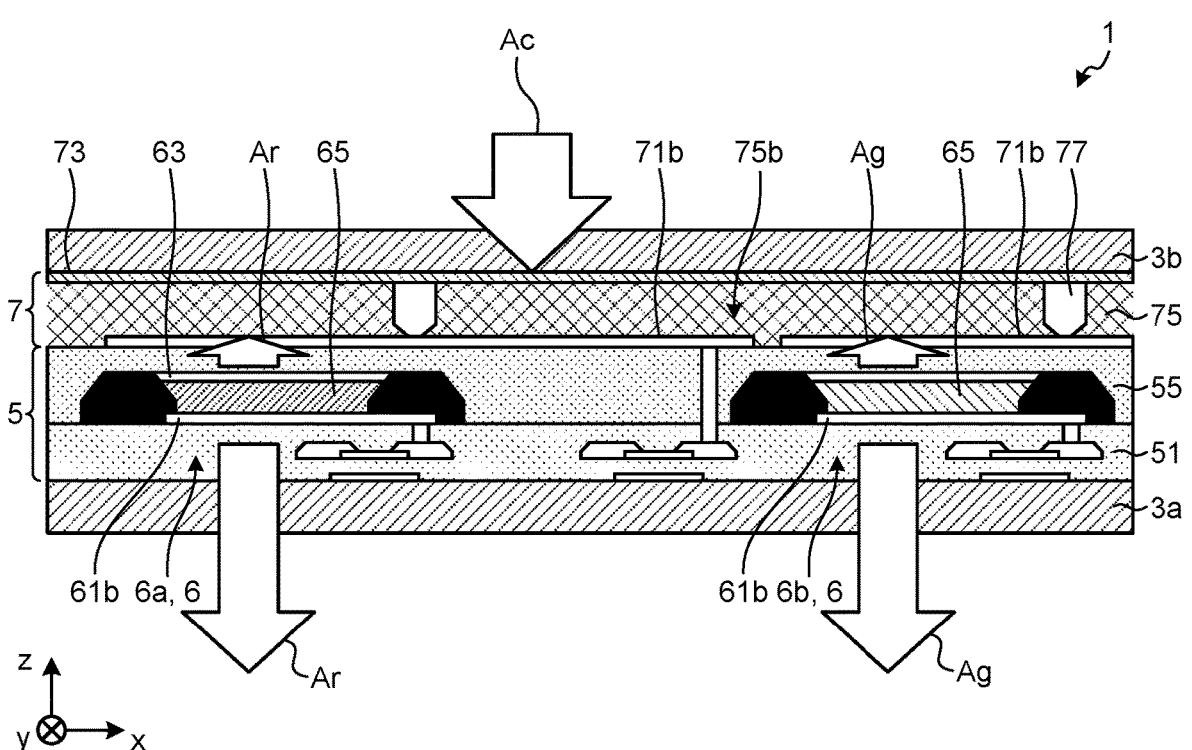
FIG. 15 is a cross-sectional view schematically illustrating an example of a configuration in a dimming mode of the transparent display device according to the sixth embodiment.

FIG. 14 is a cross-sectional view schematically illustrating an example of a configuration in a transmission mode of a transparent display device 1 according to a sixth embodiment. FIG. 15 is a cross-sectional view schematically illustrating an example of a configuration in a dimming mode of the transparent display device 1 according to the sixth embodiment.

The transparent display device 1 according to the present embodiment may be a transparent display configured to shield visible light from each of the plurality of light emitting units 6 in the dimming mode.

As illustrated in FIGS. 14 and 15, a transparent electrode 71b is provided over an entire dimming layer 7.

As indicated by an arrow Ar in FIG. 14, a light emitting unit 6a transmits red light from a light emitting layer 65 through a dimming member 75a in the transmission mode and emits the red light to the front surface side. In addition, as indicated by the arrow Ar in FIG. 14, the light emitting unit 6a also emits the red light from the light emitting layer 65 to the back surface side. Similarly, as indicated by an arrow Ag in FIG. 14, a light emitting unit 6b transmits green light from the light emitting layer 65 through the dimming member 75a in the transmission mode and emits the green light to the front surface side. In addition, as indicated by the arrow Ag in FIG. 14, the light emitting unit 6b also emits the green light from the light emitting layer 65 to the back surface side. In addition, external light Ac incident on the transparent display device 1 from the front surface side passes through a dimming member 75a in the transmission mode and is emitted from the back surface side.

On the other hand, the red light emitted from the light emitting unit 6a to the front surface side, the green light emitted from the light emitting unit 6b to the front surface side, and the external light Ac incident on the transparent display device 1 from the front surface side or the back surface side are each shielded by a dimming member 75b in the dimming mode, as illustrated in FIG. 15.

As described above, the transparent display device 1 according to the present embodiment is configured as a transparent display having display surfaces respectively disposed on both the front surface side and the back surface side. According to this configuration as well, the visibility of the display surface on the back surface side can be improved, similarly to the transparent display device 1 according to the first embodiment.

In the transparent display device 1 according to the present embodiment, similarly to the transparent display device 1 according to the second embodiment, the layer of the TFT substrate 5 on which the insulating member 55 is provided and the dimming layer 7 may be formed to be integrated.

Note that the transparent display device 1 according to the present embodiment may be provided with a plurality of color filters 79, similarly to the transparent display device 1 according to the fourth embodiment. In this case, the plurality of color filters 79 may be further provided on the back surface side of a corresponding light emitting unit 6c in addition to between a transparent electrode 73 and a glass substrate 3b.

Seventh Embodiment

Figure 16:
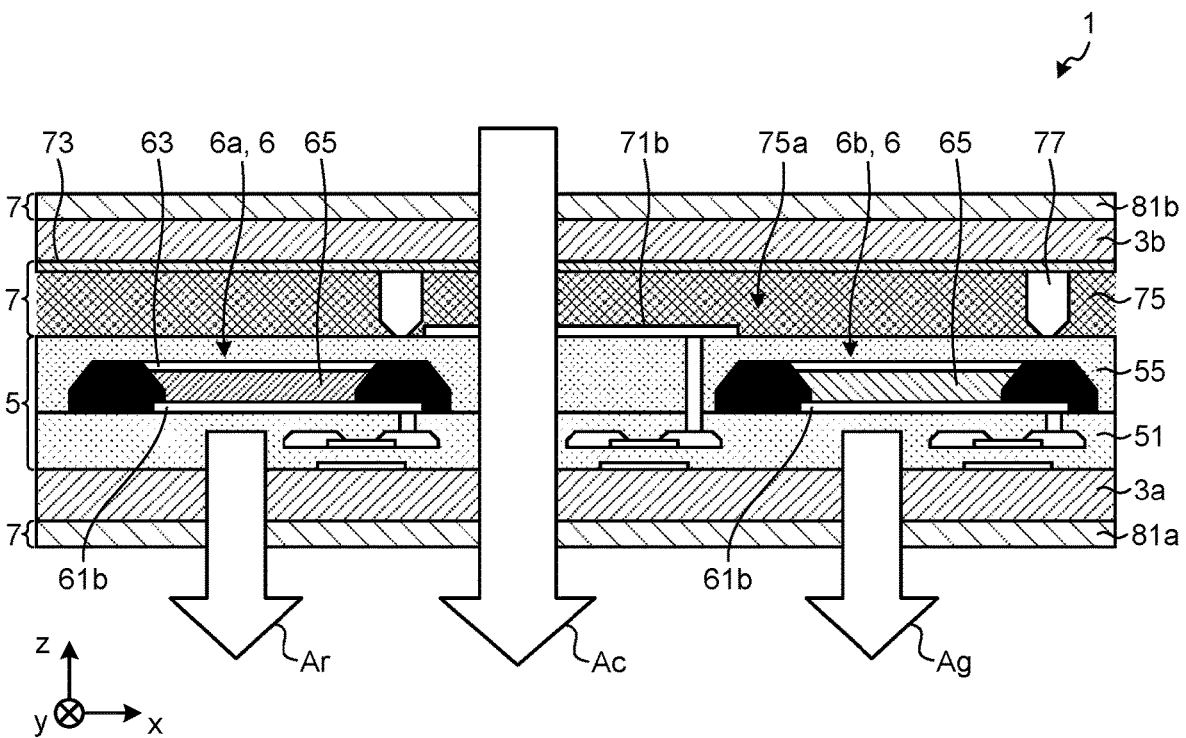
FIG. 16 is a cross-sectional view schematically illustrating an example of a configuration in a transmission mode of a transparent display device according to a seventh embodiment.
Figure 17:
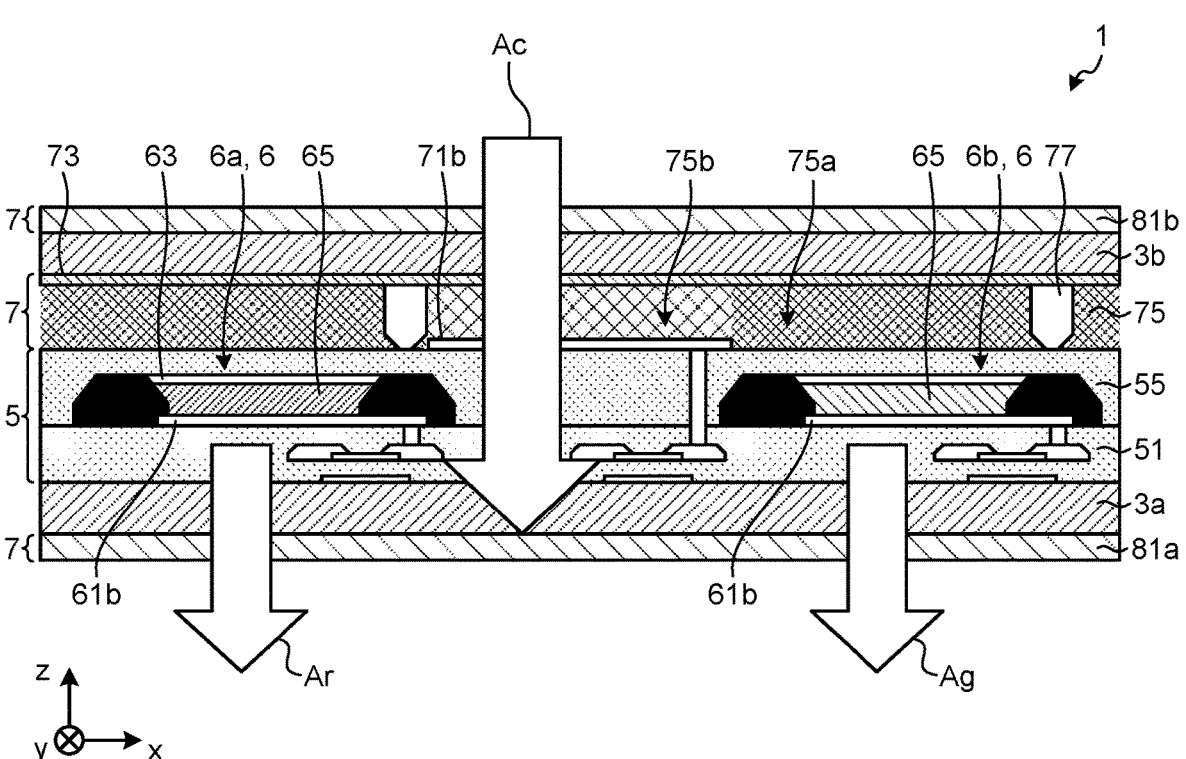
FIG. 17 is a cross-sectional view schematically illustrating an example of a configuration in a dimming mode of the transparent display device according to the seventh embodiment.

FIG. 16 is a cross-sectional view schematically illustrating an example of a configuration in a transmission mode of a transparent display device 1 according to a seventh embodiment. FIG. 17 is a cross-sectional view schematically illustrating an example of a configuration in a dimming mode of the transparent display device 1 according to the seventh embodiment.

A dimming member 75 according to the present embodiment may have a dimming function in combination with a polarizing plate 81.

As illustrated in FIGS. 16 and 17, the transparent display device 1 according to the present embodiment further includes a polarizing plate 81a and a polarizing plate 81b. The polarizing plate 81a is provided on the back surface side of a glass substrate 3a. The polarizing plate 81b is provided on the front surface side of a glass substrate 3b. Each of the polarizing plate 81a and the polarizing plate 81b may be formed of a plate-shaped member or a film-shaped member. Here, the polarizing plate 81a is an example of a first polarizing layer. Further, the polarizing plate 81b is an example of a second polarizing layer.

In the transparent display device 1 provided with the polarizing plate 81, for example, it is preferable that visibility due to external light can be improved even in a state where a user wears polarized sunglasses. Hereinafter, a description will be given as to a case in which a liquid crystal of each of a twisted nematic (TN) type, a vertical alignment (VA) type, and an in plane switching (IPS) type is used as the dimming member 75.

Here, the absorption axis of the polarized sunglasses is assumed to be, for example, 0° (horizontal direction). Further, in the transparent display device 1, it is assumed that users exist on both the front surface side and the back surface side. Generally, in a transmissive liquid crystal display (LCD), polarizing plates are disposed so as to be shifted from each other by 90° on the front and back sides. However, when the absorption axis of the polarizing plate is disposed at 90° (vertical direction), light from the display cannot pass through the polarized sunglasses, the absorption axis of which is 0°, so that the user cannot see the display on the display.

Therefore, in the transparent display device 1 according to the present embodiment, the polarizing plate 81a and the polarizing plate 81b are disposed so that the absorption axes thereof are both 0°. According to this configuration, transmittance through the polarized sunglasses, the absorption axis of which is 0°, can be made the highest as compared with other combinations of the absorption axes.

Alternatively, in the transparent display device 1 according to the present embodiment, the polarizing plate 81a and the polarizing plate 81b are disposed so that the absorption axes thereof are both 45°. In this case, the absorption axis of the polarizing plate 81a and the absorption axis of the polarizing plate 81b can be shifted by 90°.

Hereinafter, a description will be given, as an example, as to a case in which the absorption axis of the polarizing plate 81b on the front surface side is 45° and the absorption axis of the polarizing plate 81a on the back surface side is −45°.

Case where Dimming Member is TN Liquid Crystal

Non-polarized external light incident on the polarizing plate 81b on the front surface side is polarized by the polarizing plate 81b, the absorption axis of which is 45°, into linearly polarized light, the inclination of which is −45°. Here, in a state where no voltage is applied between a transparent electrode 71b and a transparent electrode 73, TN type liquid crystal molecules are twisted and aligned at 90°. The phase difference of the liquid crystal is $\lambda/2$. Therefore, the light transmitted through the dimming member 75 has linearly polarized light of 45°. The linearly polarized light, the inclination of which is 45°, incident on the polarizing plate 81a on the back surface side can be transmitted through the polarizing plate 81a, the absorption axis of which is −45°, as illustrated in FIG. 16.

On the other hand, in a state where a voltage is applied between the transparent electrode 71b and the transparent electrode 73, the TN type liquid crystal molecules are vertically aligned. The phase difference of the liquid crystal is 0. Therefore, since the light transmitted through the dimming member 75 has linearly polarized light, the inclination of which is −45°, the light cannot be transmitted through the polarizing plate 81a, the absorption axis of which is −45°, as illustrated in FIG. 17.

That is, the transparent display device 1 using the TN liquid crystal as the dimming member 75 can shield external light by applying a voltage between the transparent electrode 71b and the transparent electrode 73. Accordingly, the transparent display device 1 can improve display visibility.

Case where Dimming Member is VA Liquid Crystal

In the case of using the VA liquid crystal, if the absorption axis of the polarizing plate 81 is disposed at the same angle on both the front and back surfaces to be normally white, black does not sink, that is, contrast does not appear, so that it is preferable to shift the absorption axis by 90° on the front and back surfaces to be normally black.

In a state where no voltage is applied between the transparent electrode 71b and the transparent electrode 73, VA type liquid crystal molecules are vertically aligned. The phase difference of the liquid crystal is 0. Therefore, since the light transmitted through the dimming member 75 has linearly polarized light, the inclination of which is −45°, light cannot be transmitted through the polarizing plate 81a on the back surface side, the absorption axis of which is −45°, as illustrated in FIG. 17.

On the other hand, in a state where a voltage is applied between the transparent electrode 71b and the transparent electrode 73, the VA type liquid crystal molecules are aligned in the 0° and/or 90° direction. The phase difference of the liquid crystal is $\lambda/2$. Therefore, since the light transmitted through the dimming member 75 has right elliptically polarized light and left elliptically polarized light, the inclination of which is 45°, as illustrated in FIG. 16, a component of linearly polarized light, the inclination of which is 45°, can be transmitted through the polarizing plate 81a on the back surface side, the absorption axis of which is −45°.

That is, the transparent display device 1 using the VA liquid crystal as the dimming member 75 can shield external light by not applying a voltage between the transparent electrode 71b and the transparent electrode 73. Accordingly, the transparent display device 1 can improve display visibility.

Case where Dimming Member is IPS Liquid Crystal

In the case of using IPS liquid crystal, similarly to the case of using the VA liquid crystal, it is preferable to shift the absorption axis of the polarizing plate 81 by 90° between the front and back to obtain a normally black color.

In a state where no voltage is applied between the transparent electrode 71b and the transparent electrode 73, IPS type liquid crystal molecules are aligned at 45°. The phase difference of the liquid crystal is $\lambda/2$. Therefore, since the light transmitted through the dimming member 75 has linearly polarized light, the inclination of which is −45°, the light cannot be transmitted through the polarizing plate 81a on the back surface side, the absorption axis of which is −45°, as illustrated in FIG. 17.

On the other hand, in a state where a voltage is applied between the transparent electrode 71b and the transparent electrode 73, the IPS type liquid crystal molecules are aligned in the 0° and/or 90° directions. The phase difference of the liquid crystal is $\lambda/2$. Therefore, since the light transmitted through the dimming member 75 has right elliptically polarized light and left elliptically polarized light, the inclination of which is 45°, as illustrated in FIG. 16, a component of linearly polarized light, the inclination of which is 45°, can be transmitted through the polarizing plate 81a on the back surface side, the absorption axis of which is −45°.

That is, the transparent display device 1 using the IPS liquid crystal as the dimming member 75 can shield external light by not applying a voltage between the transparent electrode 71b and the transparent electrode 73. Accordingly, the transparent display device 1 can improve display visibility.

As described above, in the transparent display device 1 according to the seventh embodiment, the absorption axes of the polarizing plate 81a and the polarizing plate 81b are defined according to the alignment of the liquid crystal used as the dimming member 75. Therefore, according to the technique according to the present embodiment, by combining the dimming member 75 and the polarizing plate 81, it is possible to realize dimming on the pixel-by-pixel basis in the same manner as in the above-described embodiments.

In the transparent display device 1 according to the present embodiment, similarly to the transparent display device 1 according to the second embodiment, the layer of the TFT substrate 5 on which the insulating member 55 is provided and the dimming layer 7 may be formed to be integrated.

Note that the transparent display device 1 according to the present embodiment may be configured as a top emission type transparent display, similarly to the transparent display device 1 according to the third embodiment.

Note that the transparent display device 1 according to the present embodiment may be provided with a plurality of color filters 79, similarly to the transparent display device 1 according to the fourth embodiment.

Note that the transparent display device 1 according to the present embodiment may be configured as a transparent display having display surfaces on both the front surface side and the back surface side, similarly to the transparent display device 1 according to the fifth embodiment or the sixth embodiment.

Note that the transparent display device 1 according to the present embodiment may be a transparent display configured to shield visible light from each of the plurality of light emitting units 6 in the dimming mode, similarly to the transparent display device 1 according to the sixth embodiment.

Eighth Embodiment

Figure 18:
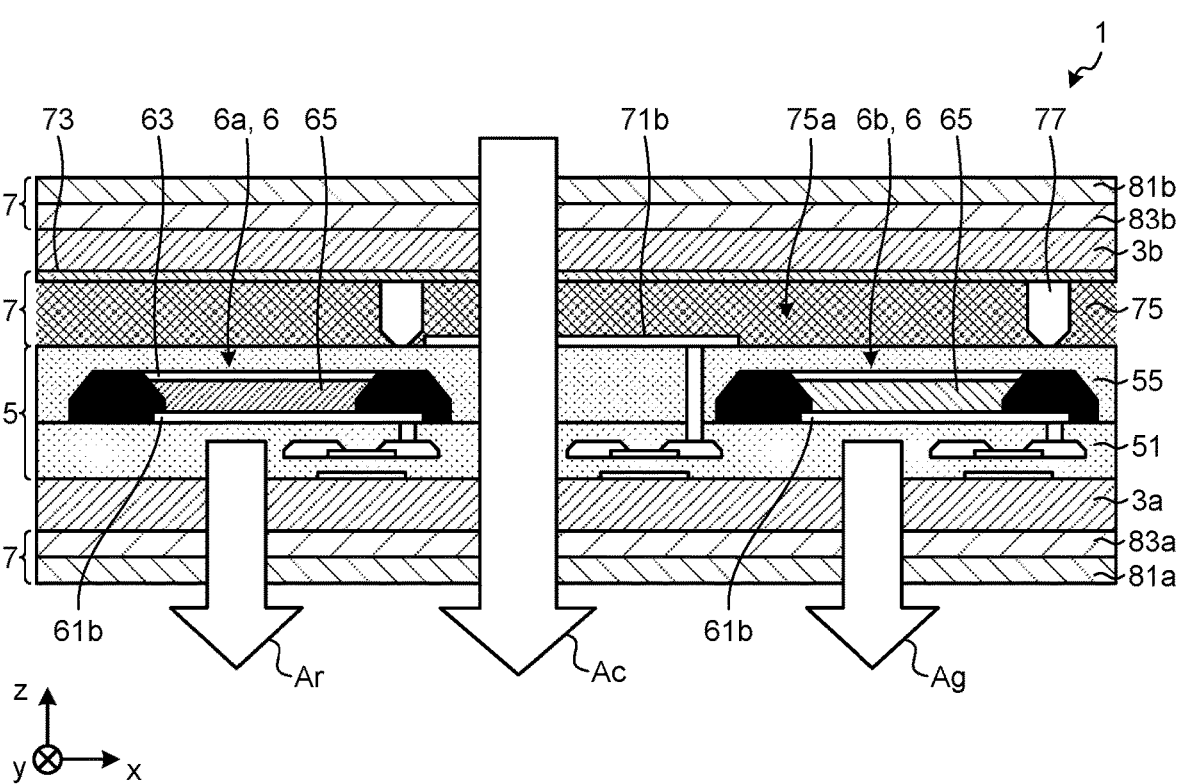
FIG. 18 is a cross-sectional view schematically illustrating an example of a configuration in a transmission mode of a transparent display device according to an eighth embodiment.
Figure 19:
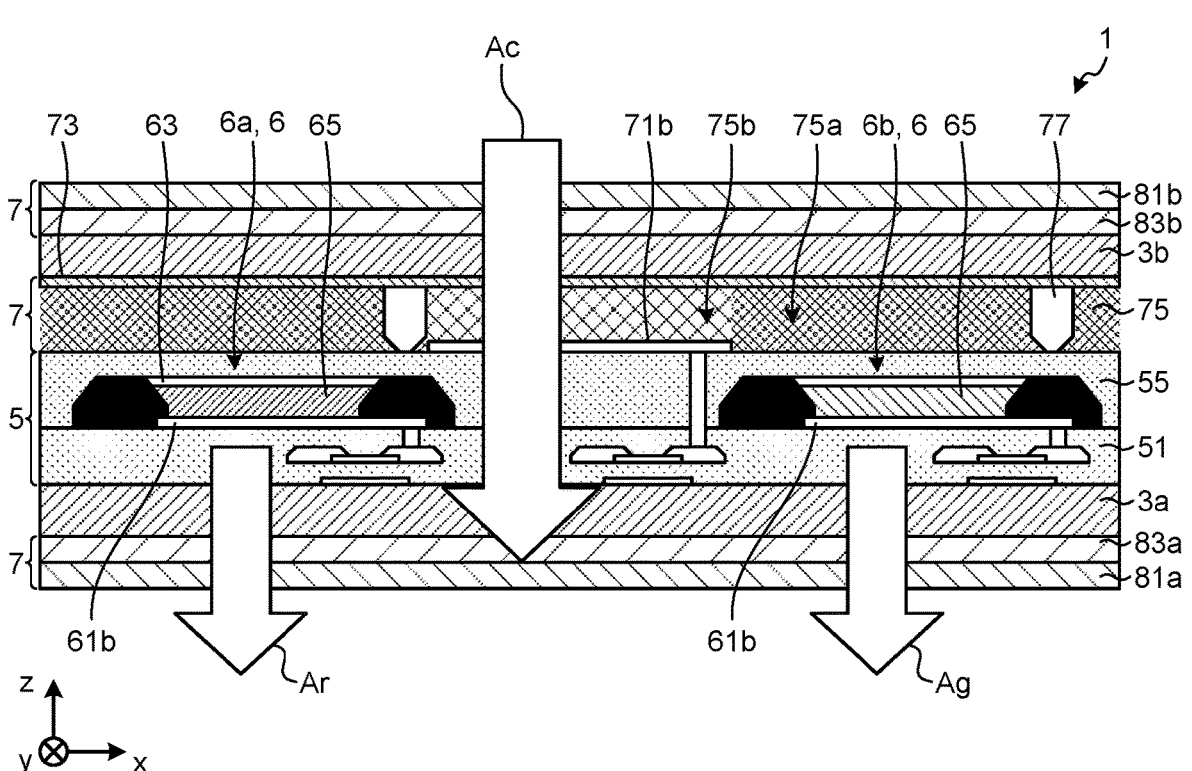
FIG. 19 is a cross-sectional view schematically illustrating an example of a configuration in a dimming mode of the transparent display device according to the eighth embodiment.

FIG. 18 is a cross-sectional view schematically illustrating an example of a configuration in a transmission mode of a transparent display device 1 according to an eighth embodiment. FIG. 19 is a cross-sectional view schematically illustrating an example of a configuration in a dimming mode of the transparent display device 1 according to the eighth embodiment.

A dimming member 75 according to the present embodiment may have a dimming function and a low reflection function by a combination of a polarizing plate 81 and a quarter-wave phase difference plate 83.

As illustrated in FIGS. 18 and 19, the transparent display device 1 according to the present embodiment further includes a quarter-wave phase difference plate 83*a* and a quarter-wave phase difference plate 83*b*. The quarter-wave phase difference plate 83*a* is provided between a glass substrate 3*a* and a polarizing plate 81*a*. The quarter-wave phase difference plate 83*b* is provided between a glass substrate 3*b* and a polarizing plate 81*b*. The quarter-wave phase difference plate 83*a* and the quarter-wave phase difference plate 83*b* may be each formed of a plate-shaped member or a film-shaped member. Here, the quarter-wave phase difference plate 83*a* is an example of a first phase difference layer. The quarter-wave phase difference plate 83*b* is an example of a second phase difference layer.

In the transparent display device 1 provided with the polarizing plate 81, for example, it is preferable that deterioration in visibility due to external light can be suppressed even in a state where a user wears polarized sunglasses. In addition, it is more preferable that deterioration in visibility due to reflected light of external light by a light emitting unit 6 such as an OLED or wiring such as an electrode provided on a TFT substrate 5 can be suppressed. Hereinafter, a description will be given as to a case in which a liquid crystal of each of the twisted nematic (TN) type and the vertical alignment (VA) type is used as the dimming member 75.

In the configuration in which the quarter-wave phase difference plate 83 is used, the light incident on the dimming member 75, that is, the light transmitted through the quarter-wave phase difference plate 83 becomes circularly polarized light, so that the arrangement direction of the liquid crystal is preferably defined for each type of the liquid crystal.

Hereinafter, a description will be given, as an example, as to a case in which the absorption axes of the polarizing plate 81*a* and the polarizing plate 81*b* respectively disposed on the front surface side and the back surface side are both 0°, and the slow axes of the quarter-wave phase difference plate 83*a* and the quarter-wave phase difference plate 83*b* respectively disposed on the front surface side and the back surface side are both 45°.

Case where Dimming Member is TN Liquid Crystal

Non-polarized external light incident on the polarizing plate 81*b* on the front surface side is polarized to linearly polarized light, the inclination of which is 90°, by the polarizing plate 81*b*, the absorption axis of which is 0°, and then the same is polarized to left circularly polarized light by the quarter-wave phase difference plate 83*b*, the slow axis of which is 45°. Here, in a state where no voltage is applied between a transparent electrode 71*b* and a transparent electrode 73, TN type liquid crystal molecules are twisted and aligned at 90°. The phase difference of the liquid crystal is $\lambda/2$. Therefore, since the light transmitted through the dimming member 75 has right circularly polarized light, a component of linearly polarized light, the inclination of which is 90°, is transmitted through the quarter-wave phase difference plate 83*a*, the slow axis of which is 45°, on the back surface side. As a result, the linearly polarized light, the inclination of which is 90°, incident on the polarizing plate 81*a* on the back surface side can be transmitted through the polarizing plate 81*a*, the absorption axis of which is 0°, as illustrated in FIG. 18.

The light transmitted through the dimming member 75 has right circularly polarized light. Therefore, the light reflected by the TFT substrate 5 on the back surface side of the dimming member 75 has left circularly polarized light. Therefore, since the light transmitted through the dimming member 75 has right circularly polarized light, a component of linearly polarized light, the inclination of which is 0°, is transmitted through the quarter-wave phase difference plate 83*b*, the slow axis of which is 45°, on the front surface side. Thus, the linearly polarized light, the inclination of which is 0°, incident on the quarter-wave phase difference plate 83*b*, the slow axis of which is 45°, on the front surface side cannot be transmitted through the polarizing plate 81*b*, the absorption axis of which is 0°.

In addition, in a state where a voltage is applied between the transparent electrode 71*b* and the transparent electrode 73, the TN type liquid crystal molecules are vertically aligned. The phase difference of the liquid crystal is 0. Therefore, since the light transmitted through the dimming member 75 has left circularly polarized light, a component of linearly polarized light, the inclination of which is 0°, is transmitted through the quarter-wave phase difference plate 83*a*, the slow axis of which is 45°, on the back surface side. As a result, the linearly polarized light, the inclination of which is 0°, incident on the polarizing plate 81*a* on the back surface side cannot be transmitted through the polarizing plate 81*a*, the absorption axis of which is 0°, as illustrated in FIG. 19.

That is, the transparent display device 1 using the TN liquid crystal as the dimming member 75 can shield external light by applying a voltage between the transparent electrode 71*b* and the transparent electrode 73. Accordingly, the transparent display device 1 can improve display visibility. In addition, it is possible to prevent reflected light of external light from the front surface side by the TFT substrate 5 from being emitted to the front surface side.

Note that the slow axis of any one of the quarter-wave phase difference plate 83a and the quarter-wave phase difference plate 83b respectively disposed on the front surface side and the back surface side can be set to –45°. In this case, the transparent display device 1 using the TN liquid crystal as the dimming member 75 can shield external light by not applying a voltage between the transparent electrode 71b and the transparent electrode 73. Accordingly, the transparent display device 1 can improve display visibility. In addition, similarly to the above-described case, it is possible to suppress reflected light of external light from the front surface side by the TFT substrate 5 from being emitted to the front surface side.

Case where Dimming Member is VA Liquid Crystal

In a state where no voltage is applied between the transparent electrode 71b and the transparent electrode 73, VA type liquid crystal molecules are vertically aligned. The phase difference of the liquid crystal is 0. Therefore, since the light transmitted through the dimming member 75 has left circularly polarized light, a component of linearly polarized light, the inclination of which is 0°, is transmitted through the quarter-wave phase difference plate 83a, the slow axis of which is 45°, on the back surface side. As a result, the linearly polarized light, the inclination of which is 0°, incident on the polarizing plate 81a on the back surface side cannot be transmitted through the polarizing plate 81a, the absorption axis of which is 0°, as illustrated in FIG. 19.

Further, the light transmitted through the dimming member 75 has left circularly polarized light. Therefore, the light reflected by the TFT substrate 5 on the back surface side of the dimming member 75 has right circularly polarized light. Therefore, since the light transmitted through the dimming member 75 has right circularly polarized light, a component of linearly polarized light, the inclination of which is 0°, is transmitted through the quarter-wave phase difference plate 83b, the slow axis of which is 45°, on the front surface side. Thus, the linearly polarized light, the inclination of which is 0°, incident on the quarter-wave phase difference plate 83b, the slow axis of which is 45°, on the front surface side cannot be transmitted through the polarizing plate 81b, the absorption axis of which is 0°.

In a state where a voltage is applied between the transparent electrode 71b and the transparent electrode 73, the VA type liquid crystal molecules are aligned at 45° and/or –45°. The phase difference of the liquid crystal is λ/2. Therefore, since the light transmitted through the dimming member 75 has right circularly polarized light and left circularly polarized light, right elliptically polarized light and left elliptically polarized light are transmitted through the quarter-wave phase difference plate 83a, the slow axis of which is 45°, on the back surface side. As a result, out of the light of the right elliptically polarized light and the left elliptically polarized light incident on the polarizing plate 81a on the back surface side, the component of the linearly polarized light, the inclination of which is 90°, can be transmitted through the polarizing plate 81a, the absorption axis of which is 0°, as illustrated in FIG. 18.

That is, the transparent display device 1 using the VA liquid crystal as the dimming member 75 can shield external light by not applying a voltage between the transparent electrode 71b and the transparent electrode 73. Accordingly, the transparent display device 1 can improve display visibility. In addition, it is possible to prevent reflected light of external light from the front surface side by the TFT substrate 5 from being emitted to the front surface side.

Note that the slow axis of any one of the quarter-wave phase difference plate 83a and the quarter-wave phase difference plate 83b respectively disposed on the front surface side and the back surface side can be set to –45°. In this case, the transparent display device 1 using the VA liquid crystal as the dimming member 75 can shield external light by applying a voltage between the transparent electrode 71b and the transparent electrode 73. Accordingly, the transparent display device 1 can improve display visibility. In addition, similarly to the above-described case, it is possible to suppress reflected light of external light from the front surface side by the TFT substrate 5 from being emitted to the front surface side.

As described above, with the transparent display device 1 of the seventh embodiment, by combining the dimming member 75, the polarizing plate 81, and the quarter-wave phase difference plate 83, dimming on the pixel-by-pixel basis can be realized in the same manner as in the above-described embodiment. In addition, it is possible to suppress deterioration in visibility due to reflected light of external light on the TFT substrate 5.

In the transparent display device 1 according to the present embodiment, similarly to the transparent display device 1 according to the second embodiment, the layer of the TFT substrate 5 on which the insulating member 55 is provided and the dimming layer 7 may be formed to be integrated.

Note that the transparent display device 1 according to the present embodiment may be configured as a top emission type transparent display, similarly to the transparent display device 1 according to the third embodiment.

Note that the transparent display device 1 according to the present embodiment may be provided with a plurality of color filters 79, similarly to the transparent display device 1 according to the fourth embodiment.

Note that the transparent display device 1 according to the present embodiment may be configured as a transparent display having display surfaces on both the front surface side and the back surface side, similarly to the transparent display device 1 according to the fifth embodiment or the sixth embodiment.

Note that the transparent display device 1 according to the present embodiment may be a transparent display configured to shield visible light from each of the plurality of light emitting units 6 in the dimming mode, similarly to the transparent display device 1 according to the sixth embodiment.

Ninth Embodiment

Figure 20:
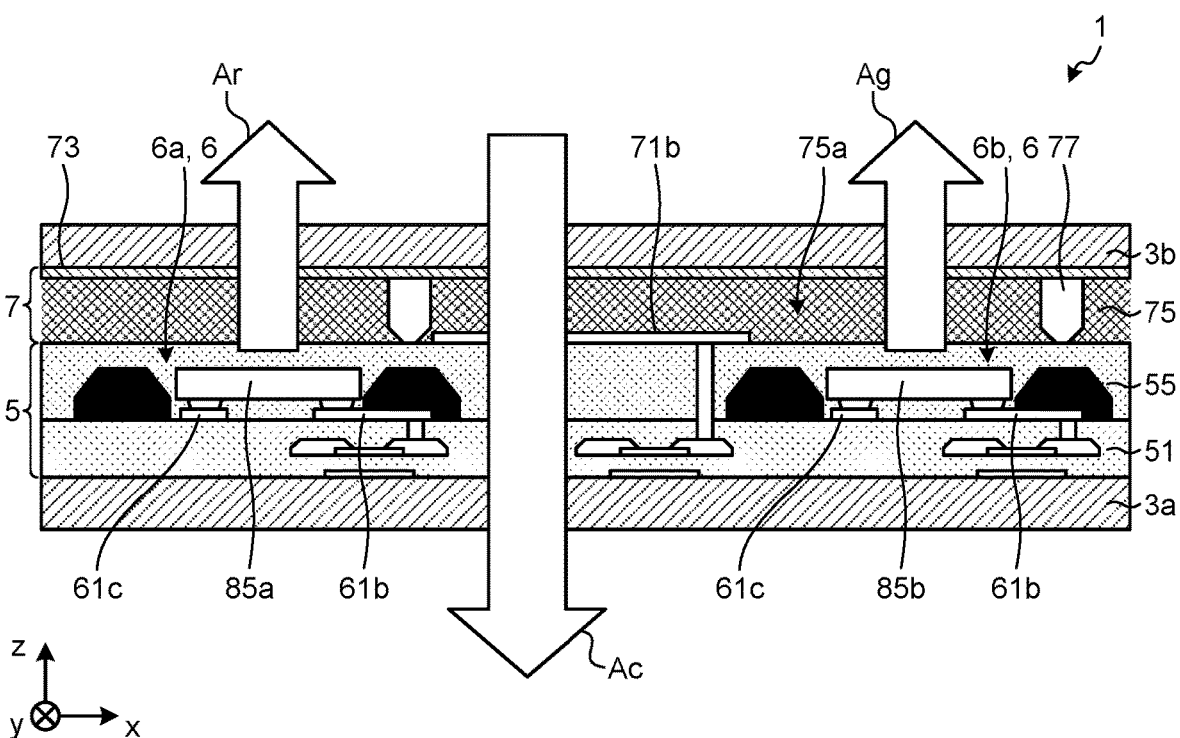
FIG. 20 is a cross-sectional view schematically illustrating an example of a configuration in a transmission mode of a transparent display device according to a ninth embodiment.
Figure 21:
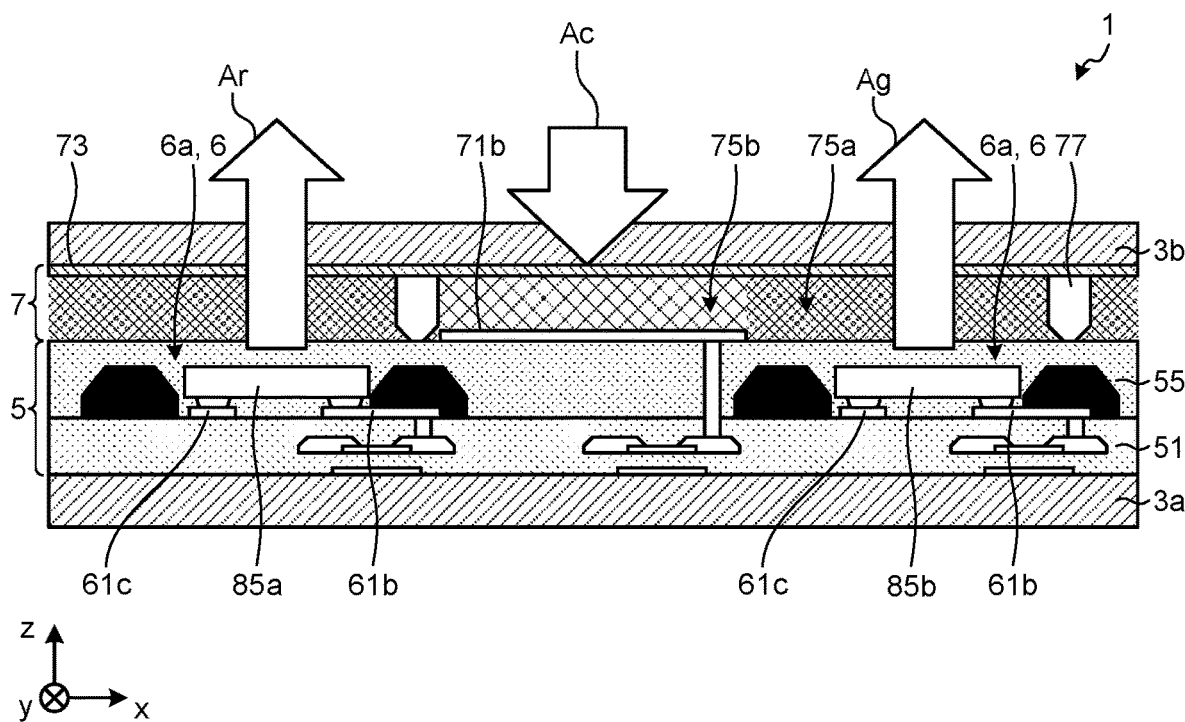
FIG. 21 is a cross-sectional view schematically illustrating an example of a configuration in a dimming mode of the transparent display device according to the ninth embodiment.

FIG. 20 is a cross-sectional view schematically illustrating an example of a configuration in a transmission mode of a transparent display device 1 according to a ninth embodiment. FIG. 21 is a cross-sectional view schematically illustrating an example of a configuration in a dimming mode of the transparent display device 1 according to the ninth embodiment.

The transparent display device 1 according to the present embodiment is not limited to the OLED as a light emitting unit 6, and may be a transparent display configured using an LED 85 such as a mini LED or a micro LED. FIGS. 20 and 21 illustrate an LED 85a and an LED 85b as the LED 85.

The LED 85 of the light emitting unit 6 is electrically connected to a transparent electrode 61b and a transparent electrode 61c. For example, the LED 85a of the light emitting unit 6a is a red light emitting diode. For example, the LED 85b of the light emitting unit 6b is a green light emitting diode.

As described above, the transparent display device 1 according to the present embodiment includes the LED 85 such as the mini LED or the micro LED instead of the OLED as the light emitting unit 6. According to this configuration as well, similarly to the transparent display device 1 according to the first embodiment, visibility can be improved. In addition, the occurrence of ghosting can be reduced as compared with the OLED. In addition, the life of the light emitting unit 6 can be extended as compared with the OLED.

In the transparent display device 1 according to the present embodiment, similarly to the transparent display device 1 according to the second embodiment, the layer of the TFT substrate 5 on which the insulating member 55 is provided and the dimming layer 7 may be formed to be integrated.

Note that the transparent display device 1 according to the present embodiment may be configured as a top emission type transparent display, similarly to the transparent display device 1 according to the third embodiment.

Note that the transparent display device 1 according to the present embodiment may be provided with a plurality of color filters 79, similarly to the transparent display device 1 according to the fourth embodiment.

Note that the transparent display device 1 according to the present embodiment may be configured as a transparent display having display surfaces on both the front surface side and the back surface side, similarly to the transparent display device 1 according to the fifth embodiment or the sixth embodiment.

Note that the transparent display device 1 according to the present embodiment may be a transparent display configured to shield visible light from each of the plurality of light emitting units 6 in the dimming mode, similarly to the transparent display device 1 according to the sixth embodiment.

Note that the transparent display device 1 according to the present embodiment may have a configuration that realizes a dimming function by a combination of a dimming member 75 and a polarizing plate 81, similarly to the transparent display device 1 according to the seventh embodiment.

In the same manner as the transparent display device 1 according to the eighth embodiment, the transparent display device 1 according to the present embodiment may have a configuration that realizes a dimming function and a reflection reducing function by a combination of the dimming member 75, the polarizing plate 81, and the quarter-wave phase difference plate 83.

Dimming Control in Transparent Display Device

Here, dimming control in the transparent display device 1 according to each of the above-described embodiments will be described with reference to the drawings.

Figure 22:
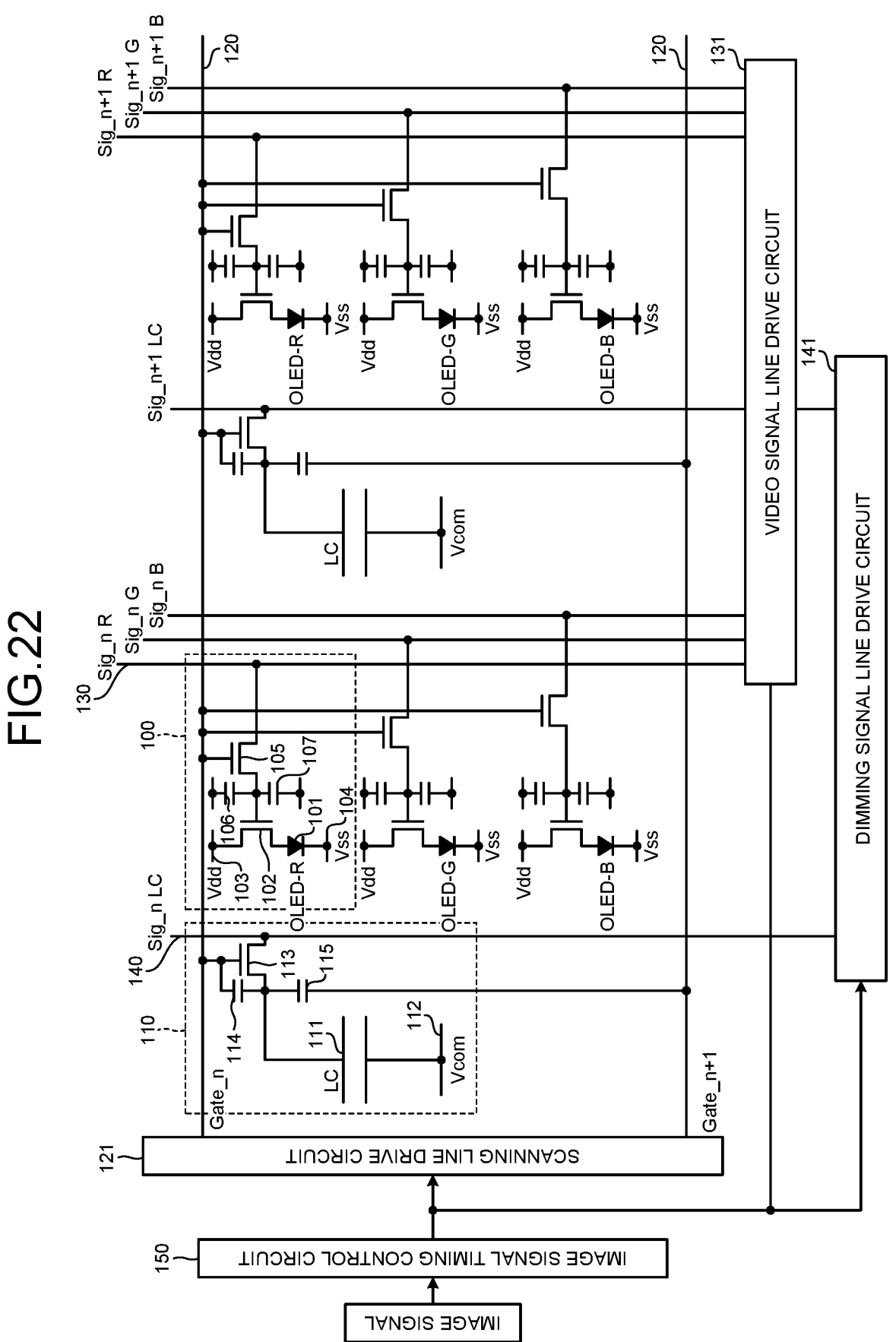
FIG. 22 is a cross-sectional view schematically illustrating an example of a circuit configuration of a transparent display device according to an embodiment.

FIG. 22 is a diagram schematically illustrating an example of a circuit configuration of the TFT substrate 5 of the transparent display device 1 according to the embodiment.

As illustrated in FIG. 22, the TFT substrate 5 includes a plurality of light emitting pixels 100 and a plurality of dimming pixels 110. The plurality of light emitting pixels 100 and the plurality of dimming pixels 110 are arranged in a matrix on the TFT substrate 5. Each of the plurality of light emitting pixels 100 is configured to be able to emit light independently. Each of the plurality of dimming pixels 110 independently changes its transmittance with respect to visible light. The plurality of dimming pixels 110 are arranged at positions different from the plurality of light emitting pixels 100 in plan view.

As illustrated in FIG. 22, each of the plurality of light emitting pixels 100 includes a light emitting element 101, a TFT 102, a TFT 105, a holding capacitor 106, and a holding capacitor 107.

The anode of the light emitting element 101 is electrically connected to the drain of the TFT 102 via the transparent electrode 61a and the transparent electrode 61b. The cathode of the light emitting element 101 is electrically connected to a power supply wiring 104 on the Vss side via the reflective electrode 63. The light emitting element 101 emits light with luminance corresponding to a current value flowing between the anode and the cathode.

The TFT 102 is a drive transistor of the light emitting element 101. The TFT 102 is, for example, a P-type TFT. The source and the drain of the TFT 102 are implemented by the source-drain electrode 53b. The gate of the TFT 102 is implemented by the gate electrode 53a. The source of TFT 102 is electrically connected to a power supply wiring 103 on the Vdd side. The gate of the TFT 102 is electrically connected to the drain of the TFT 105. The gate of the TFT 102 is electrically connected to the power supply wiring 103 on the Vdd side via the holding capacitor 106 and the holding capacitor 107. The TFT 102 supplies a current corresponding to the voltage held in the holding capacitor 106 and the holding capacitor 107 to the light emitting element 101.

The TFT 105 is a switch transistor of the light emitting element 101. The TFT 105 is, for example, a P-type TFT. The source of the TFT 105 is electrically connected to a video signal line 130. The TFT 105 is turned on or off according to the voltage applied by a scanning line drive circuit 121.

The holding capacitor 106 and the holding capacitor 107 hold a potential difference between the potential of the power supply wiring 103 on the Vdd side when the TFT is turned off and the potential of the gate of the TFT 102. That is, the holding capacitor 106 and the holding capacitor 107 hold a voltage corresponding to a signal voltage.

As illustrated in FIG. 22, each of the plurality of dimming pixels 110 includes a liquid crystal element 111, a TFT 113, a holding capacitor 114, and a holding capacitor 115.

The liquid crystal element 111 corresponds to the dimming member 75 of the dimming layer 7. Specifically, the liquid crystal element 111 corresponds to the dimming member 75 positioned between the transparent electrode 71b and the transparent electrode 73 in the dimming member 75. One end of the liquid crystal element 111 is electrically connected to a power supply wiring 112 on the Vcom side via the transparent electrode 73. The other end of the liquid crystal element 111 is electrically connected to the drain of the TFT 113.

The TFT 113 is a switch transistor of the liquid crystal element 111. The TFT 113 is, for example, a P-type TFT. The holding capacitor 114 is electrically connected between the gate and the drain of the TFT 113. The TFT 113 is turned on or off according to the voltage applied by the scanning line drive circuit 121.

As illustrated in FIG. 22, the TFT substrate 5 includes a plurality of scanning lines 120, the scanning line drive circuit 121, the plurality of video signal lines 130, a video signal line drive circuit 131, a plurality of dimming signal lines 140, a dimming signal line drive circuit 141, and an image signal timing control circuit 150.

The scanning line drive circuit 121 is electrically connected to the plurality of scanning lines 120. FIG. 22 illustrates scanning line Gate_n and scanning line Gate_n+1 as the plurality of scanning lines 120. The scanning line Gate_n is electrically connected to the gate of the TFT 105 of each of the plurality of light emitting pixels 100 and the gate of the TFT 113 of each of the plurality of dimming pixels 110. The scanning line Gate_n+1 is electrically connected to the drain of each TFT 113 via the holding capacitor 115 of each of the plurality of dimming pixels 110. The scanning line drive circuit 121 is electrically connected to the drain of the TFT 113 via the holding capacitor 115.

The scanning line drive circuit 121 outputs a scanning signal to the plurality of scanning lines 120 to sequentially scan the plurality of light emitting pixels 100. Specifically, the TFT 105 is turned on or off on the row-by-row basis. As a result, the scanning line drive circuit 121 applies a signal voltage output from the video signal line drive circuit 131 in the plurality of video signal lines 130 to the plurality of light emitting pixels 100 in the selected row, and causes the light emitting pixels 100 to emit light with luminance corresponding to video data.

Similarly, the scanning line drive circuit 121 sequentially scans the plurality of dimming pixels 110 by outputting a scanning signal to the plurality of scanning lines 120. Specifically, the TFT 113 is turned on or off on the-row-by-row basis. As a result, the scanning line drive circuit 121 applies a signal voltage output from the dimming signal line drive circuit 141 to the plurality of dimming pixels 110 in the selected row, and changes the transmittance of the liquid crystal element 111 of the dimming pixel 110 according to dimming data.

The video signal line drive circuit 131 is electrically connected to the plurality of video signal lines 130. FIG. 22 illustrates Sig_nR, Sig_nG, Sig_nB, Sig_n+1R, Sig_n+1G, and Sig_n+1B as the plurality of video signal lines 130. The video signal line Sig_nR is electrically connected to the source of the TFT 105 of the light emitting pixel 100 of an OLED-R. The video signal line Sig_nG is electrically connected to the source of the TFT 105 of the light emitting pixel 100 of an OLED-G. The video signal line Sig_nB is electrically connected to the source of the TFT 105 of the light emitting pixel 100 of an OLED-B. Here, the OLED-R is an OLED that emits red light. The OLED-G is an OLED that emits green light. The OLED-B is an OLED that emits blue light.

The video signal line drive circuit 131 applies a signal voltage corresponding to the video data to each of the plurality of light emitting pixels 100 via the plurality of video signal lines 130.

The dimming signal line drive circuit 141 is electrically connected to the plurality of dimming signal lines 140. FIG. 22 illustrates a dimming signal line Sig_nLC and a dimming signal line Sig_n+1LC as the plurality of dimming signal lines 140. The dimming signal line Sig_nLC and the dimming signal line Sig_n+1LC are electrically connected to the source of the TFT 113 of the corresponding dimming pixel 110.

The dimming signal line drive circuit 141 applies a signal voltage corresponding to the dimming data to each of the plurality of dimming pixels 110 via the plurality of dimming signal lines 140.

The image signal timing control circuit 150 is electrically connected to each of the scanning line drive circuit 121, the video signal line drive circuit 131, and the dimming signal line drive circuit 141. The image signal timing control circuit 150 controls, based on the input image signal, operation timings of the scanning line drive circuit 121, the video signal line drive circuit 131, and the dimming signal line drive circuit 141. Here, the image signal timing control circuit 150 is an example of a control circuit.

FIG. 23 is a signal waveform diagram schematically illustrating an example of dimming control of the transparent display device 1 according to the embodiment.

As illustrated in FIG. 23, the image signal timing control circuit 150 controls the scanning line drive circuit 121 to raise a scanning line signal Vg at a timing corresponding to the input image signal. The scanning line drive circuit 121 generates, for example, a rectangular pulse signal at a timing under the control of the image signal timing control circuit 150, sequentially scans the plurality of light emitting pixels 100, and sequentially scans the plurality of dimming pixels 110. Therefore, the pulse width of the pulse signal corresponds to one scanning period.

In addition, based on the input image signal, the image signal timing control circuit 150 supplies a signal voltage corresponding to the video data to the video signal line drive circuit 131, and supplies a signal voltage corresponding to the dimming data to the video signal line drive circuit 131.

Here, as illustrated in FIG. 23, the image signal timing control circuit 150 controls, based on the input image signal, the amplitude of a dimming signal Vsig applied from the dimming signal line drive circuit 141 to each of the plurality of dimming pixels 110 for each frame.

As described above, the image signal timing control circuit 150 controls, based on the input image signal, the amplitude of the dimming signal Vsig applied to each of the plurality of dimming pixels 110 for each frame. In other words, the image signal timing control circuit 150 controls, based on the input image signal, the transmittance of the liquid crystal element 111 of the dimming pixel 110.

Furthermore, the image signal timing control circuit 150 can control, based on the input image signal, the light emission of each of the plurality of light emitting pixels 100 and the dimming of each of the plurality of dimming pixels 110 by controlling a timing at which the scanning line signal Vg rises. In other words, the image signal timing control circuit 150 can control light emission and dimming of each pixel in the transparent display device 1 by one gate pulse signal. According to this configuration, dimming on the pixel-by-pixel basis according to image data to be displayed can be easily realized.

As hardware of the image signal timing control circuit 150, for example, a processor such as an application specific integrated circuit (ASIC) or a field programmable gate array (FPGA) can be appropriately used.

Note that the image signal timing control circuit 150 includes, for example, a processor such as a central processing unit (CPU) and a memory such as a random access memory (RAM), and may implement the above-described control by allowing the processor to execute a control program loaded in the memory. In this case, the control program may be provided by being incorporated in advance in, for example, a read only memory (ROM) or the like. In addition, the control program may be provided by being recorded in a computer-readable recording medium such as a CD-ROM, a flexible disk (FD), a CD-R, and a digital versatile disk (DVD) as a file in an installable format or an executable format. Furthermore, the control program may be stored on a computer connected to a network such as the Internet and provided by being downloaded via the network. Further, the control program may be provided or distributed via a network such as the Internet.

The present disclosure can provide a transparent display device capable of achieving further improvement.

While certain embodiments have been described, these embodiments have been presented by way of example only, and are not intended to limit the scope of the inventions.

Indeed, the novel methods and systems described herein may be embodied in a variety of other forms; furthermore, various omissions, substitutions and changes in the form of the methods and systems described herein may be made without departing from the spirit of the inventions. The accompanying claims and their equivalents are intended to cover such forms or modifications as would fall within the scope and spirit of the inventions.

Furthermore, the technique described in each of the above embodiments can also be understood as follows.

(1)

A transparent display device including:

a first substrate capable of transmitting visible light;

a first internal layer provided on a first main surface of the first substrate, a plurality of light emitting pixels each configured to emit light independently and a region capable of transmitting the visible light being arranged in the first internal layer;

a second internal layer provided on a side of the first internal layer opposite to the first substrate, the second internal layer including a plurality of dimming pixels arranged at positions different from positions of the plurality of light emitting pixels in plan view and each configured to change transmittance thereof to the visible light independently; and a second substrate provided on a side of the second internal layer opposite to the first internal layer, the second substrate being capable of transmitting the visible light.

(2)

The transparent display device according to (1), in which:

the first internal layer has a circuit configuration electrically connected to each of the plurality of light emitting pixels; and the second internal layer includes:

a first electrode electrically connected to the circuit configuration and provided at a position different from the positions of the plurality of light emitting pixels in plan view, the first electrode being capable of transmitting the visible light;

a second electrode provided on a side of the second substrate facing the first electrode to be spaced apart from the first electrode, the second electrode being capable of transmitting the visible light; and a dimming member provided between the first electrode and the second electrode, the dimming member changing transmittance thereof with respect to the visible light according to a voltage applied between the first electrode and the second electrode.

(3)

The transparent display device according to (1) or (2), in which each of the plurality of dimming pixels is provided between the plurality of light emitting pixels in the first internal layer.

(4)

The transparent display device according to any one of (1) to (3), further including:

a first polarizing layer provided on a side of the first substrate opposite to the first internal layer and configured to polarize the visible light; and a second polarizing layer provided on a side of the second substrate opposite to the second internal layer and configured to polarize the visible light, in which:

each of the plurality of dimming pixels includes a liquid crystal element; and an absorption axis of the first polarizing layer and an absorption axis of the second polarizing layer are defined according to an orientation of the liquid crystal element.

(5)

The transparent display device according to any one of (1) to (4), further including a control circuit configured to control, based on an image signal, on or off timing of a switch provided for each of the plurality of light emitting pixels and the plurality of dimming pixels.

What is claimed is:

1. A transparent display device comprising:

a first substrate capable of transmitting visible light;

an internal layer provided on a main surface of the first substrate, the internal layer including a plurality of light emitting pixels and a plurality of dimming pixels that are arranged at different positions in plan view, each of the plurality of light emitting pixels being capable of emitting light independently, and each of the plurality of dimming pixels independently changing transmittance thereof with respect to the visible light; and a second substrate provided on a side of the internal layer opposite to the first substrate, the second substrate being capable of transmitting the visible light, wherein the internal layer includes:

a first internal layer provided on a side of the first substrate, in which the plurality of light emitting pixels and a region capable of transmitting the visible light are arranged; and a second internal layer provided on a side of the second substrate, in which the plurality of dimming pixels are arranged at positions corresponding to the region capable of transmitting the visible light, each of the plurality of light emitting pixels includes a transparent electrode transparent to the visible light, a reflective electrode opaque to the visible light, and a light emitting layer located between the transparent electrode and the reflective electrode, and the transparent electrode is sandwiched between the second internal layer and the reflective electrode in cross-sectional view.

2. The transparent display device according to claim 1, wherein the second internal layer is located between the first internal layer and the second substrate in cross-sectional view.

3. The transparent display device according to claim 1, wherein the plurality of light emitting pixels includes a first light emitting pixel, and the first light emitting pixel is located between the second internal layer and the first substrate in cross-sectional view.

4. The transparent display device according to claim 1, wherein the second internal layer includes:

a first electrode provided at a position different from positions of the plurality of light emitting pixels in plan view, the first electrode being capable of transmitting the visible light;

a second electrode provided on the side of the second substrate facing the first electrode to be spaced apart from the first electrode, the second electrode being capable of transmitting the visible light; and a dimming member provided between the first electrode and the second electrode, the dimming member changing transmittance thereof with respect to the visible light according to a voltage applied between the first electrode and the second electrode.

5. The transparent display device according to claim 4, wherein the first electrode is provided on the first internal layer.

6. The transparent display device according to claim 4, wherein the first electrode is provided for each of the plurality of dimming pixels.

7. The transparent display device according to claim 4, wherein the first electrode is provided for each of the plurality of dimming pixels, and extends up to a position covering an adjacent light emitting pixel among the plurality of light emitting pixels.

8. The transparent display device according to claim 1, wherein each of the plurality of dimming pixels is provided between the plurality of light emitting pixels in the internal layer.

9. The transparent display device according to claim 8, wherein the internal layer includes:

a first electrode provided at a position different from positions of the plurality of light emitting pixels in plan view, the first electrode being capable of transmitting the visible light;

a second electrode provided on a side of the second substrate facing the first electrode to be spaced apart from the first electrode, the second electrode being capable of transmitting the visible light; and a dimming member provided between the first electrode and the second electrode, the dimming member changing transmittance thereof with respect to the visible light according to a voltage applied between the first electrode and the second electrode.

10. The transparent display device according to claim 1, wherein a light emitting surface of each of the plurality of light emitting pixels is provided on a side facing the first substrate.

11. The transparent display device according to claim 10, further comprising a plurality of color filters provided between the light emitting surface of each of the plurality of light emitting pixels and the first substrate, each of the plurality of color filters having predetermined wavelength selectivity.

12. The transparent display device according to claim 1, wherein a light emitting surface of each of the plurality of light emitting pixels is provided on a side facing the second substrate.

13. The transparent display device according to claim 12, further comprising a plurality of color filters provided between the light emitting surface of each of the plurality of light emitting pixels and the second substrate, each of the plurality of color filters having predetermined wavelength selectivity.

14. The transparent display device according to claim 13, wherein each of the plurality of color filters is provided between the second substrate and the internal layer.

15. The transparent display device according to claim 1, wherein a light emitting surface of each of the plurality of light emitting pixels is provided on each of a side facing the first substrate and a side facing the second substrate.

16. A transparent display device comprising:

a first substrate capable of transmitting visible light;

an internal layer provided on a main surface of the first substrate, the internal layer including a plurality of light emitting pixels and a plurality of dimming pixels that are arranged at different positions in plan view, each of the plurality of light emitting pixels being capable of emitting light independently, and each of the plurality of dimming pixels independently changing transmittance thereof with respect to the visible light; and a second substrate provided on a side of the internal layer opposite to the first substrate, the second substrate being capable of transmitting the visible light, wherein the internal layer includes:

a first internal layer provided on a side of the first substrate, in which the plurality of light emitting pixels and a region capable of transmitting the visible light are arranged; and a second internal layer provided on a side of the second substrate, in which the plurality of dimming pixels are arranged at positions corresponding to the region capable of transmitting the visible light, the second internal layer includes:

a first electrode provided at a position different from positions of the plurality of light emitting pixels in plan view, the first electrode being capable of transmitting the visible light;

a second electrode provided on the side of the second substrate facing the first electrode to be spaced apart from the first electrode, the second electrode being capable of transmitting the visible light; and a dimming member provided between the first electrode and the second electrode, the dimming member changing transmittance thereof with respect to the visible light according to a voltage applied between the first electrode and the second electrode, and the first internal layer includes a transistor electrically connected to the first electrode.

17. A transparent display device comprising:

a first substrate capable of transmitting visible light;

an internal layer provided on a main surface of the first substrate, the internal layer including a plurality of light emitting pixels and a plurality of dimming pixels that are arranged at different positions in plan view, each of the plurality of light emitting pixels being capable of emitting light independently, and each of the plurality of dimming pixels independently changing transmittance thereof with respect to the visible light; and a second substrate provided on a side of the internal layer opposite to the first substrate, the second substrate being capable of transmitting the visible light, wherein the internal layer includes:

a first internal layer provided on a side of the first substrate, in which the plurality of light emitting pixels and a region capable of transmitting the visible light are arranged; and a second internal layer provided on a side of the second substrate, in which the plurality of dimming pixels are arranged at positions corresponding to the region capable of transmitting the visible light, each of the plurality of light emitting pixels includes a transparent electrode transparent to the visible light, a reflective electrode opaque to the visible light, and a light emitting layer located between the transparent electrode and the reflective electrode, and the reflective electrode is located between the second internal layer and the transparent electrode in cross-sectional view.

* * * * *